US009147699B2

(12) United States Patent
Park et al.

(10) Patent No.: US 9,147,699 B2
(45) Date of Patent: Sep. 29, 2015

(54) DISPLAY DEVICE WITH REDUNDANT TRANSISTOR STRUCTURE

(71) Applicant: LG Display Co., Ltd., Seoul (KR)

(72) Inventors: ChongHun Park, Paju-si (KR); Soonil Yun, Paju-si (KR); Iigi Jeong, Chungcheongbuk-do (KR); Kyungsu Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/476,431

(22) Filed: Sep. 3, 2014

(65) Prior Publication Data

US 2015/0187804 A1 Jul. 2, 2015

(30) Foreign Application Priority Data

Dec. 27, 2013 (KR) ........................ 10-2013-0165291

(51) Int. Cl.
*H01L 27/12* (2006.01)
*H01L 29/786* (2006.01)
*H01L 29/417* (2006.01)
*H01L 29/423* (2006.01)

(52) U.S. Cl.
CPC .......... *H01L 27/124* (2013.01); *H01L 27/1222* (2013.01); *H01L 27/1225* (2013.01); *H01L 27/1255* (2013.01); *H01L 29/41733* (2013.01); *H01L 29/42384* (2013.01); *H01L 29/7869* (2013.01); *H01L 29/78663* (2013.01); *H01L 29/78672* (2013.01)

(58) Field of Classification Search
CPC .............................. H01L 27/146; H01L 31/18
See application file for complete search history.

(56) References Cited

U.S. PATENT DOCUMENTS

| 6,624,870 | B1 * | 9/2003 | Greene et al. ................ 349/153 |
| 2001/0046007 | A1 * | 11/2001 | Greene et al. ................ 349/73 |
| 2008/0239223 | A1 * | 10/2008 | Fujita ................................ 349/138 |

FOREIGN PATENT DOCUMENTS

| JP | 7-199221 A | 8/1995 |
| JP | 10-107150 A | 4/1998 |
| JP | 11-97701 A | 4/1999 |

* cited by examiner

*Primary Examiner* — Jaehwan Oh
(74) *Attorney, Agent, or Firm* — Birch, Stewart, Kolasch & Birch, LLP

(57) ABSTRACT

Provided is a display device including: a display panel including a plurality of data lines and gate lines formed to define a plurality of pixels; a data drive unit; and a gate drive unit, wherein the display panel is provided with a transistor that includes: a first electrode unit configured to receive a first voltage and including two first electrodes; a second electrode unit configured to receive a second voltage and including two second electrodes; a third electrode unit configured to receive a third voltage and including a common third electrode, the third electrode unit being formed to include a bent portion between the first electrode unit and the second electrode unit; and two channels formed to be spaced apart from each other adjacent to opposite ends of the third electrode unit and configured to correspondingly connect the two first electrodes and the two second electrodes, respectively.

19 Claims, 22 Drawing Sheets

DISPLAY DEVICE WITH REDUNDANT TRANSISTOR STRUCTURE

CROSS-REFERENCE TO RELATED APPLICATION

This application claims priority from and the benefit under 35 U.S.C. §119(a) of Korean Patent Application No. 10-2013-0165291, filed on Dec. 27, 2013, which is hereby incorporated by reference for all purposes as if fully set forth herein.

BACKGROUND OF THE INVENTION

1. Field of the Invention

The present invention relates to a display device with a redundant transistor structure.

2. Description of the Related Art

A display panel for use in a display device such as a liquid display device or an organic light-emitting display device is, in general, provided with at least one transistor for displaying an image.

A transistor within each pixel in a display panel is fabricated through a number of processes. During the processes, fine foreign substances, particles, and/or impurities may undesirably be included in the transistors (in particular, in the channel regions). In such an instance, the transistor may be electrically shorted or disconnected and, thus, the transistor may not function normally. This may cause a pixel defect which changes the corresponding pixel into a bright dot or a dark dot.

Such a pixel defect which changes a pixel into a bright dot or a dark dot may considerably degrade the quality of the image of display devices and reduce the yield of display panel production.

Thus, a repair process has been conventionally performed so as to change a defective pixel that appears as a bright dot, e.g., due to fine foreign substances, rather into a dark dot such that the defective pixel cannot be visually recognized.

However, when there are an excessive number of pixels that have changed into dark dots by the conventional repair process on a display panel, the quality of the image of the display may be seriously degraded to an extent that the display panel is not of commercial value, which may result in the display panel being discarded.

Thus, there is a need for an efficient repair process for fixing defective pixels.

SUMMARY OF THE INVENTION

Accordingly, the present invention has been proposed in an effort to solve the above-mentioned problems, and an aspect of the present invention is to provide a display device having a redundant transistor structure that, when a pixel defect occurs due to foreign particles/substances/impurities introduced into a transistor in the display device, enables a repair process such that the corresponding pixel may function as a normal pixel.

Another aspect of the present invention is to provide a display device having a redundant transistor structure which is capable of enhancing the repair success rate as well as enabling a repair process.

Yet another aspect of the present invention is to provide a display device having a redundant transistor structure which does not reduce the aperture ratio of the display panel as well as enables a repair process of the display panel.

Still another aspect of the present invention is to provide a display device including at least one pixel, which can be subjected to a repair process using the redundant transistor structure as described above.

In order to accomplish the above-described objects, in accordance with an aspect of the present invention, there is provided a display device including: a display panel in which a plurality of data lines and gate lines are formed to define a plurality of pixels; a data drive unit configured to supply a data voltage to the data lines; and a gate drive unit configured to supply a scan signal to the gate lines. The display panel is provided with a transistor that includes: a first electrode unit applied with a first voltage and configured to function as two first electrodes; a second electrode unit formed with a second voltage and configured to function as two second electrodes; a third electrode unit applied with a third voltage and configured to function as a common third electrode, the third electrode unit being formed to be bent between the first electrode unit and the second electrode unit; and two channels formed to be spaced apart from each other at points where opposite ends of the third electrode unit are positioned and configured to correspondingly connect the two first electrodes and the two second electrodes, respectively.

In accordance with another aspect of the present invention, there is provided a display device including: a display panel in which a data line and a gate line are formed; a data drive unit configured to supply a data voltage to the data lines; and a gate drive unit configured to supply a scan signal to the gate lines. The display panel is provided with a transistor that includes: a first electrode unit applied with a first voltage and configured to function as two first electrodes; a second electrode unit formed with a second voltage and configured to function as two second electrodes; a third electrode unit applied with a third voltage and configured to function as a common third electrode, the third electrode unit being formed in a "—" shape between the first electrode unit and the second electrode unit; and two channels formed in parallel to each other at points where opposite ends of the third electrode unit are positioned and configured to correspondingly connect the two first electrodes and the two second electrodes, respectively.

As described above, the present invention may provide a display device having a redundant transistor structure which enables a repair process in such a manner that, when a foreign substance exists in a transistor and causes a pixel defect, the corresponding pixel can still function as a normal pixel.

In addition, the present invention may provide a display device having a redundant transistor structure capable of enhancing the repair success rate as well as enabling a repair process.

Further, the present invention may provide a display device having a redundant transistor structure which does not reduce the aperture ratio of the display panel, while enabling enables a repair process.

Further, the present invention may provide a display device including at least one pixel that may be subjected to a repair process using a redundant transistor structure.

BRIEF DESCRIPTION OF THE DRAWINGS

The above and other objects, features and advantages of the present invention will be more more apparent from the following detailed description taken in conjunction with the accompanying drawings, in which.

DETAILED DESCRIPTION OF EXEMPLARY EMBODIMENTS

Figure 1:
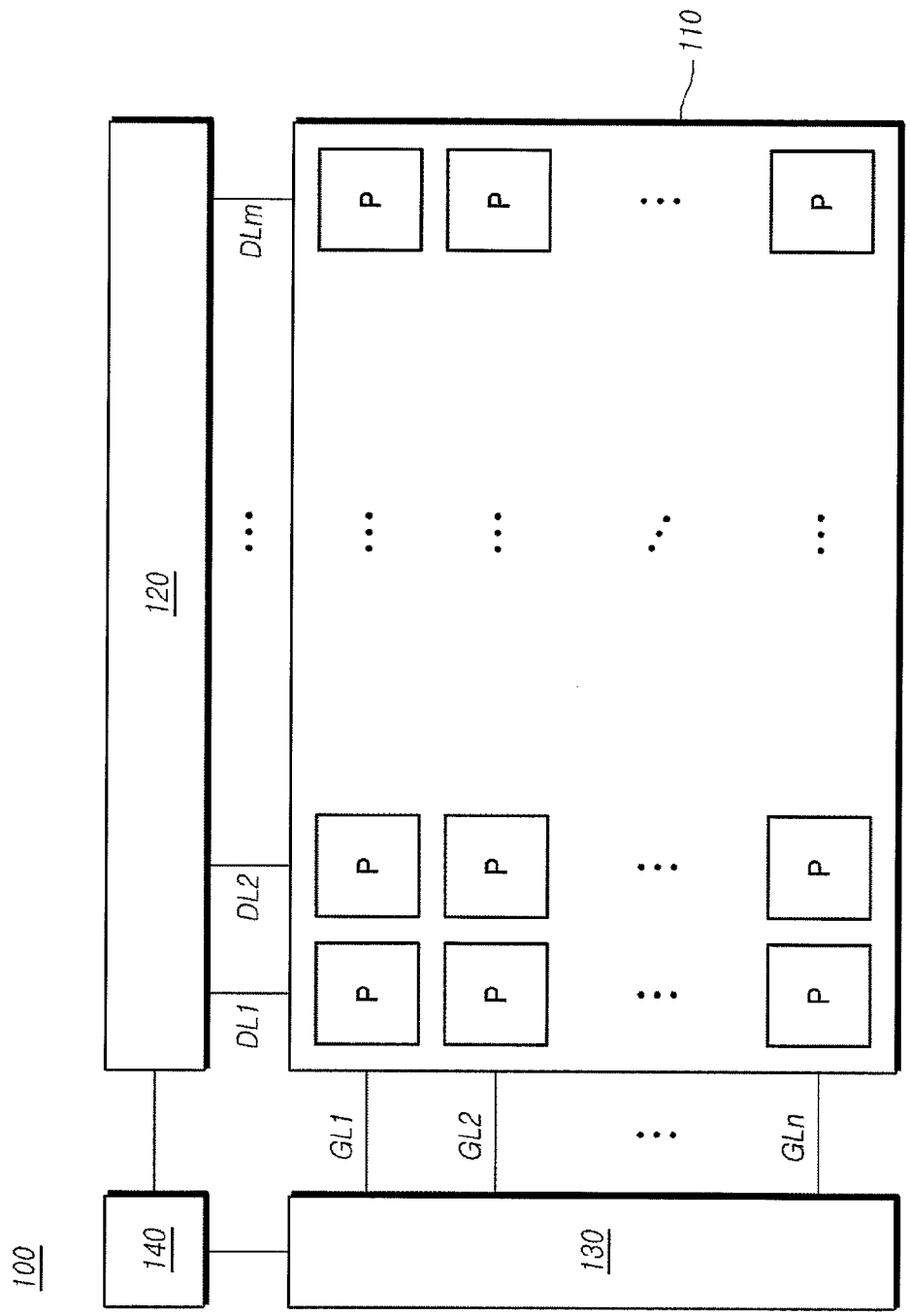
FIG. 1 is a view illustrating a system configuration of a display device in accordance with embodiments of the present invention.

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if it is described in the specification that one component is "connected," "coupled" or "joined" to another component, a third component may be "interposed" between the first and second components, although the first component may be directly "connected", "coupled" or "joined" to the second component.

FIG. 1 illustrates a system configuration of a display device 100 according to one or more embodiments of the present invention.

Referring to FIG. 1, the display device 100 according to embodiments of the present invention includes: a display panel 110 formed with m data lines DL1 to DLm and n gate lines GL1 to GLn; a data drive unit 120 configured to supply a data voltage to the m data lines DL1 to DLm; a gate drive unit 130 configured to supply a scan signal to the n gate lines GL1 to GLn; and a timing controller 140 configured to control a drive timing of the data drive unit 120 and the gate drive unit 130.

The above-mentioned gate drive unit 130 may be positioned on only one side of the display panel 110 as illustrated in FIG. 1 or may be divided into two and positioned on both sides of the display panel 110, depending on the driving type of the gate drive unit 130.

In addition, the gate drive unit 130 may include a plurality of gate drive integrated circuits. The plurality of gate drive integrated circuits may be connected to a bonding pad of the display panel 110 through a Tape Automated Bonding (TAB) method or a Chip On Glass (COG) method, or implemented in a Gate In Panel (GIP) type and directly formed in the display panel 110. In one embodiment, the plurality of gate drive integrated circuits may be integrated and formed in the display panel 110.

In addition, the data drive unit 120 may include a plurality of data drive integrated circuits (also referred to as "source driving integrated circuits"). The plurality of data drive integrated circuits may be connected to a bonding pad of the display panel by the TAB method or the COG method or directly formed in the display panel 110. In one embodiment, the plurality of data drive integrated circuits may be integrated and formed in the display panel 110.

The display device 100 according to embodiments of the present invention may be a Liquid Crystal Display (LCD), or an Organic Light-Emitting Display (OLED) or the like. However, the display device 100 may include at least one transistor in each of a plurality of pixels defined in the display panel 110 regardless of the type of the display device 100.

When it comes to transistors in display devices, a transistor disposed in a pixel may malfunction or may not function at all when it is shorted or disconnected due to the introduction of undesired foreign substances in the manufacturing process. In that instance, the corresponding pixel typically appears to be a bright dot or a dark dot, thereby becoming a defective pixel.

Thus, the present disclosure proposes various transistor structures that, when a transistor in a pixel is shorted or disconnected due to the introduction of foreign substances in the manufacturing process and, hence, the corresponding pixel becomes a defective pixel, enable a repair process of the defective pixel after which the pixel can function as a normal pixel. Here, the repair process may be performed during the panel fabrication process prior to the manufacturing of the product being completed.

First, a common equivalent circuit diagram of various transistor structures according to embodiments of the present invention will be described with reference to FIG. 2, and then, the transistor structures according to embodiments of the present invention will be described in detail with reference to various exemplary embodiments.

Figure 2:
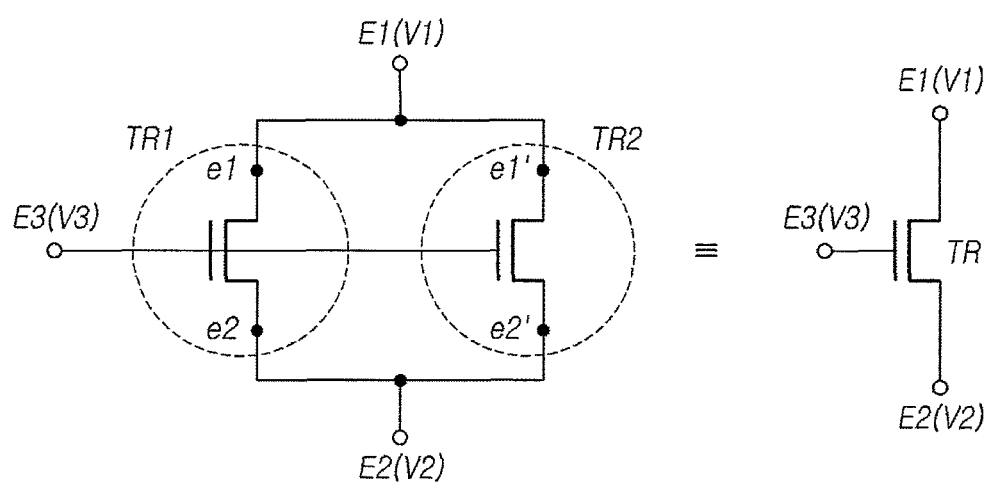
FIG. 2 is an equivalent circuit diagram of a transistor according to embodiments of the present invention.

FIG. 2 is an equivalent circuit diagram of a transistor TR according to embodiments of the present invention.

Referring to FIG. 2, the transistor TR according to embodiments of the present invention is a transistor disposed in each of a plurality of pixels defined in a display panel 110 of a display device 100 and has a redundant structure in which a first transistor TR1 and a second transistor TR2 are connected in parallel to each other.

Among the plurality of pixels in the display panel 110, in a normal pixel which has not been repaired, the first transistor TR1 and the second transistor TR2 are connected in parallel to each other to perform a switching operation. Thus, the switching operation in a normal pixel is performed in the same manner that one transistor TR performs its switching operation.

Among the plurality of pixels in the display panel 110, in a repaired pixel, one of the first transistor TR1 and the second transistor TR2 is cut (i.e., disconnected), and only the remaining one performs the switching operation. This will be described in more detail below.

Referring to FIG. 2, the transistor TR includes: a first electrode unit E1 applied with a first voltage V1 and which configured to function as two first electrodes e1 and e1'; a second electrode unit E2 applied with a second voltage V2 and configured to function as two second electrodes e2 and e2; a third electrode unit E3 applied with a third voltage V3 and configured to function as a common third electrode; and two channels CH1 and CH2 configured to correspondingly connect the two first electrodes e1 and e1' and the two second electrodes e2 and e2', respectively.

Here, the first transistor TR1 includes the first electrode e1 of the first electrode unit E1, the second electrode e2 of the second electrode unit E2, the third electrode unit E3, and the channel CH1 that interconnects the first electrode e1 of the first electrode unit E1 and the second electrode e2 of the second electrode unit E2. The second transistor TR2 includes the first electrode e1' of the first electrode unit E1, the second electrode e2' of the second electrode unit E2, the third electrode unit E3, and the channel CH2 which interconnects the first electrode e1' of the first electrode unit E1 and the second electrode e2' of the second electrode unit E2.

In addition, the first transistor TR1 and the second transistor TR2 are connected in parallel to each other and function as a single transistor TR.

That is, the first voltage V1 is commonly applied to the first and second transistors TR1 and TR2 through the first electrode unit E1 which functions as the two first electrodes e1 and e1', the third voltage V3 which corresponds to a gate voltage is commonly applied to the first and second transistors TR1 and TR2 through the third electrode unit E3, and the second voltage V2 is commonly formed in the second electrode unit E2 which functions as the two second electrodes e2 and e2'.

In the present specification, the first electrode unit E1 and the two first electrodes e1 and e1' formed therein may be a source electrode or a drain electrode, and the second electrode unit E2 and the two second electrodes e2 and e2' formed therein may be a drain electrode or a source electrode. In addition, the third electrode unit E3 may be a gate electrode.

Referring to FIG. 2, all the transistors are illustrated as an N type according to one embodiment. However, this is merely for ease of description, and one skilled in the art would readily appreciate that the transistors may be designed as a P type according to one embodiment.

Hereinafter, the structures of transistors TR having a redundant structure in which the first transistor TR1 and the second transistor TR2 are connected in parallel to each other will be described in accordance with six exemplary embodiments, which may be differentiated from each other by the gate type and the semiconductor layer material type.

First, a transistor TR according to a first exemplary embodiment will be described with reference to FIGS. 3 to 5.

Figure 3:
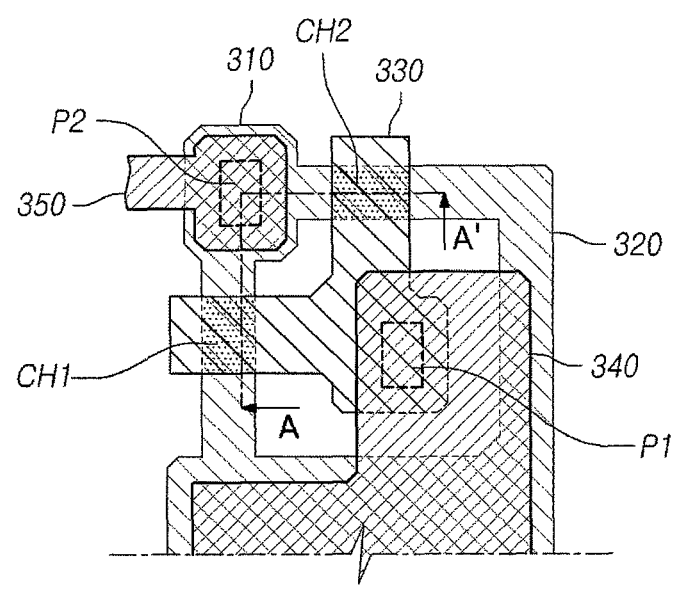
FIG. 3 is a plan view of a transistor according to a first exemplary embodiment.
Figure 4:
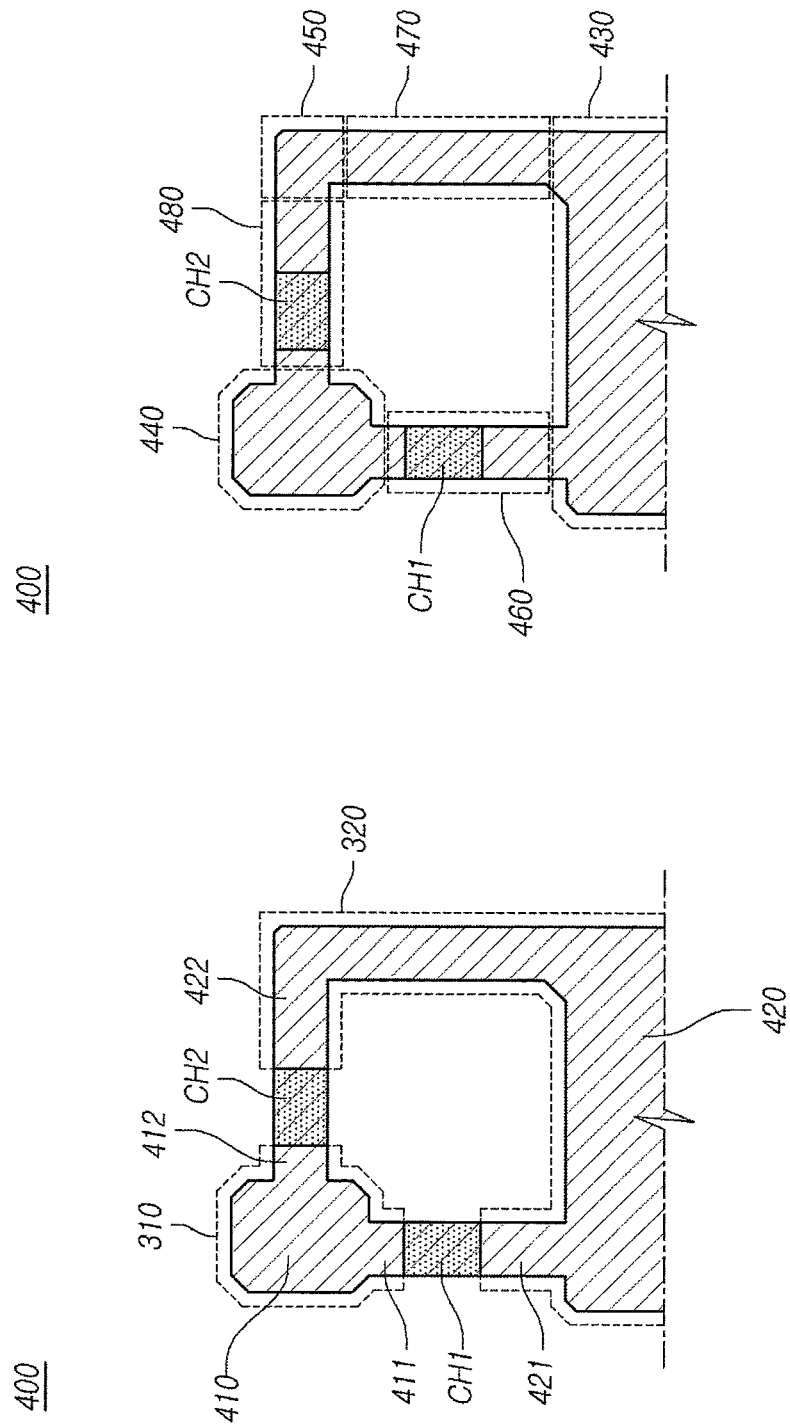
FIG. 4 is a view illustrating a single body of the transistor TR according to the first exemplary embodiment.
Figure 5:
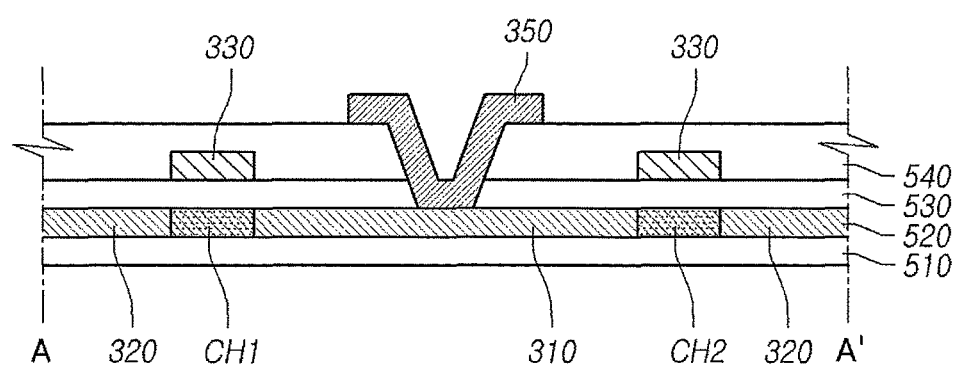
FIG. 5 is a cross-sectional view of the transistor according to the first exemplary embodiment.

As illustrated in FIGS. 3 to 5, transistor 300 according to the first exemplary embodiment is a single bent gate type in which a third electrode unit 330 corresponding to a gate electrode is bent at one position, and the semiconductor material is made of a metallic oxide semiconductor material.

FIG. 3 is a plan view of the transistor 300 according to the first exemplary embodiment, FIG. 4 illustrates a single body 400 of the transistor 300 according to the first exemplary embodiment in which a first electrode unit 310, a second electrode unit 320 and channels CH1 and CH2 are formed together, and FIG. 5 is a cross-sectional view of the transistor 300 according to the first exemplary embodiment.

Referring to FIGS. 3 to 5, the transistor 300 according to the first embodiment includes a first electrode unit 310, a second electrode unit 320, and a third electrode unit 330.

The first electrode unit 310 is applied with a first voltage V1 and functions as two first electrodes.

In accordance with one embodiment, the first electrode unit 310 is formed with a first electrode body 410 and two first electrode protrusions 411 and 412 which function as the two first electrodes and protrude from the first electrode body 410.

The second electrode unit 320 receives a second voltage V2 and functions as two second electrodes.

In accordance with one embodiment, the second electrode unit 320 is formed with a second electrode body 420 and two second electrode protrusions 421 and 422 which function as the two second electrodes and protrude from the second electrode body 420.

The third electrode unit 330 is applied with a third voltage V3 and functions as a common third electrode. The third electrode unit 330 is formed to be bent between the first electrode unit 310 and the second electrode unit 320.

In accordance with one embodiment, the third electrode unit 330 is bent in a "⌐" shape or an "⌐" shape.

A bent point P1 of the third electrode unit 330 may be a point where the voltage V3 is applied.

In addition, at the bent point P1, the third electrode unit 330 may be connected with a first plate 340 of a capacitor through a contact hole, and the second electrode unit 320 may be connected with a second plate of the capacitor or function as the second plate, thereby forming one capacitor.

When FIGS. 3 and 4 are compared with FIG. 2, the first electrode unit 310, the second electrode unit 320, and the third electrode unit 330 in FIG. 3 correspond to the first electrode unit E1, the second electrode unit E2, and the third electrode unit E3 in FIG. 2, respectively. In addition, the two first electrode protrusions 411 and 412 in FIG. 4 correspond to the first electrode e1 of the first transistor TR1 and the first electrode e1' of the second transistor TR2 in FIG. 2, respectively. The two second electrode protrusions 421 and 422 in FIG. 4 correspond to the second electrode e2 of the first transistor TR1 and the second electrode e2' of the second transistor TR2, respectively.

In accordance with one embodiment, the two channels CH1 and CH2 are formed to be spaced apart from each other at the points where opposite ends of the third electrode unit 330 are positioned, and correspondingly connect the two first electrodes of the first electrode unit 310 and the two second electrodes of the second electrode unit 320, respectively. That is, the two channels CH1 and CH2 are positioned at the positions where the two first electrode protrusions 411 and 412 face the two second electrode protrusions 421 and 422, respectively.

In accordance with one embodiment, the two channels CH1 and CH2 are formed not to be parallel to each other. That is, when viewed in FIGS. 3 and 4, the channel CH1 is formed in a vertical direction, while the channel CH2 is formed in a horizontal direction, for example.

As described above, the two channels CH1 and CH2 are formed not to be parallel to each other, in particular, to be orthogonal to each other. For the above-described structural characteristics of channels, end portions of the two first electrode protrusion 411 and 412 are formed to be orthogonal to each other, and end portions of the two second electrode protrusions 421 and 422 are formed to be orthogonal to each other.

Referring to FIG. 4, the first electrode unit 310, the second electrode unit 320 and the channels CH1 and CH2 of the transistor 300 are formed together in the single body 400.

The single body 400 is made of, for example, a semiconductor material.

In the single body 400 made of a semiconductor material as described above, other than the region where the two channels CH1 and CH2 will be formed, only a remaining region is made conductive so as to form the first electrode unit 310 and the second electrode unit 320.

Here, the semiconductor material may be, for example, a metallic oxide semiconductor material.

The metallic oxide semiconductor material may be, for example, a zinc-oxide based material. Alternatively, the metallic oxide semiconductor material may be a zinc-oxide based material containing indium. Specifically, the metallic oxide semiconductor material may be, for example, IGZO (Indium Gallium Zinc Oxide), ZTO (Zinc Tin Oxide), and IZO (Indium Zinc Oxide).

Thus, the first electrode unit 310 and the second electrode unit 320 may be formed by making the single body 400 conductive by a plasma process or an ion doping process in which the single body 400 may be made of any of the above-mentioned metallic oxide semiconductor materials.

When the first electrode unit 310 and the second electrode unit 320 are formed in the regions made conductive in the single body 400 as described above, the non-metalized regions correspond to the two channels CH1 and CH2, respectively.

Referring to FIG. 5, a process of forming the transistor 300 according to the first exemplary embodiment illustrated in FIG. 3 is described. FIG. 5 is a cross-sectional view taken along A-A' in FIG. 3.

First, a semiconductor layer 520 is formed on a substrate 510. Here, the semiconductor layer 520 corresponds to the single body 400 of FIG. 4. Here, the semiconductor layer 520 may also be referred to as an active layer.

In the semiconductor layer 520, other than the regions where the two channels CH1 and CH2 will be formed, the remaining region is made conductive to form the first electrode unit 310 and the second electrode unit 320.

After the semiconductor layer 520 is made conductive, the first electrode unit 310 and the second electrode unit 320 are formed in the regions which are made conductive in the semiconductor layer 520, and the regions which are not made conductive form the two channels CH1 and CH2.

A gate insulation layer 530 is formed on the semiconductor layer 520 which has been made partially conductive.

The third electrode unit 330 corresponding to a gate electrode is formed on the gate insulation layer 530.

Since the third electrode unit 330 is bent in the "⌐" shape or the "∟" shape when viewed in the plan view of FIG. 3, the third electrode unit 330 overlaps with the semiconductor layer 520 corresponding to the single body 400 at two points.

After the third electrode unit 330 corresponding to the gate electrode is formed, an interlayer insulation film 540 is formed, and a signal wire 350 configured to supply the first voltage V1 to the first electrode unit 310 is connected with the first electrode unit 310 through a contact hole at a point P2.

Further, when the two channels CH1 and CH2 are close to each other within a certain distance, it is highly probable that, when one of the first transistor TR1 formed with the channel CH1 and the second transistor TR2 formed with the channel CH2 is shorted or disconnected, one or both of the first electrode and the second electrode of the shorted or disconnected transistor may not be precisely cut, thereby resulting in a failure of a repair.

Accordingly, in order to enhance the repair success rate without reducing the aperture ratio of the display panel 110, the first exemplary embodiment forms the two channels CH1 and CH2 not to be parallel to each other as illustrated in FIGS. 3 and 4 such that the two channels CH1 and CH2 are as distant from each other as possible.

When the two channels CH1 and CH2 are formed not to be parallel to each other, the single body 400 may include a "⊏" shape section in which the first electrode unit 310, the second electrode unit 320, and the two channels CH1 and CH2 are formed, as illustrated in FIGS. 3 and 4. The single body 400 illustrated in FIG. 4 is the "⊏" shape section.

Referring to FIG. 4, the "⊏" shape section included in the single body 400 includes a body portion 430, corner portions 440 and 450, side bars 460 and 470 connecting the body portion 430 and the corner portion 440 and 450, and a side bar 480 connecting the corner portions 440 and 450.

Referring to FIG. 4, the first electrode unit 310 is formed in one corner portion 440 of the "⊏" shape section included in the single body 400, and the two channels CH1 and CH2 are formed in two side bars 460 and 480 which are not parallel to each other and connected to the one corner portion 440 where the first electrode unit 310 is formed.

The transistor 300 according to the first exemplary embodiment which is described above with reference to FIGS. 3 to 5 may be referred to as, for example, an oxide Thin Film Transistor (TFT).

Hereinafter, a transistor 600 according to a second exemplary embodiment will be described with reference to FIGS. 6 and 7.

The transistor 600 according to the second exemplary embodiment (to be described below) is the same as the transistor 300 according to the first exemplary embodiment in that the transistor 600 is a single bent gate type transistor in which a third electrode unit 630 corresponding to the gate electrode is bent at one position. However, the transistor 600 is different from the transistor 300 according to the first exemplary embodiment in that the semiconductor material of the transistor 600 is not made of a metallic oxide semiconductor material but made of amorphous silicon (a-Si:H) or Low Temperature Polycrystalline Silicon (LTPS). Accordingly, hereinafter, the features of the transistor 600 according to the second exemplary embodiment which are different from those of the transistor 300 according to the first exemplary will be mainly described.

Figure 6:
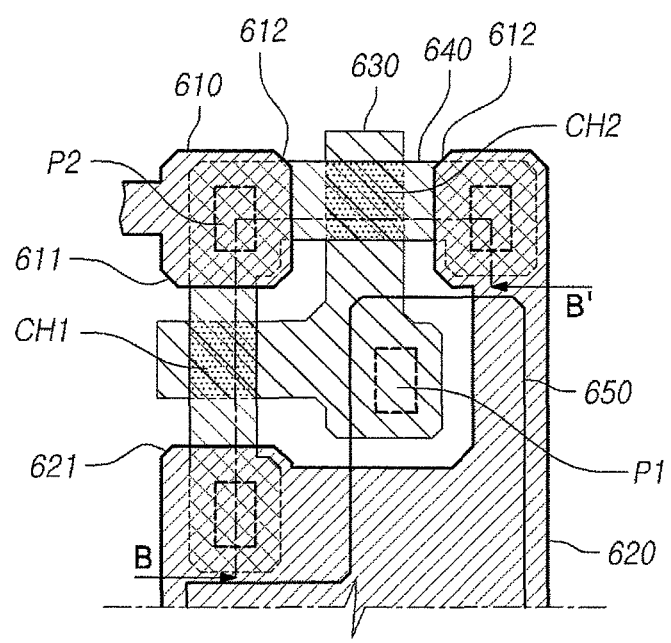
FIG. 6 is a plan view of a transistor according to a second exemplary embodiment.
Figure 7:
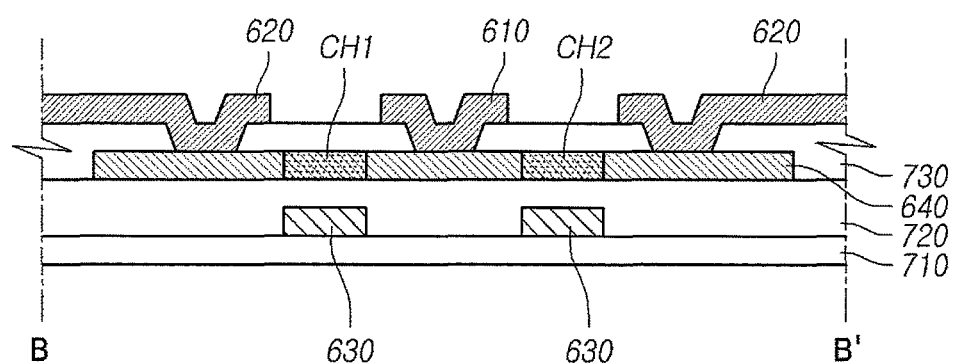
FIG. 7 is a cross-sectional view of the transistor according to the second exemplary embodiment.

FIG. 6 is a plan view of the transistor 600 according to the second exemplary embodiment and FIG. 7 is a cross-sectional view of the transistor 600 according to the second exemplary embodiment.

Referring to FIGS. 6 and 7, the transistor 600 according to the second exemplary embodiment is a single bent gate type transistor in which a third electrode unit 630 is bent at one position.

Referring to FIGS. 6 and 7, the transistor 600 according to the second exemplary embodiment includes: a first electrode unit 610 applied with a first voltage V1 and configured to function as two first electrodes; a second electrode unit 620 formed with a second voltage V2 and configured to function as two second electrodes; a third electrode unit 630 applied with a third electrode V3 and configured to function as a common third electrode, the third electrode unit 630 being formed between the first electrode unit 610 and the second electrode unit 620 to be bent; and two channels CH1 and CH2 formed to be spaced apart from points where the opposite ends of the third electrode unit 630 are positioned, and configured to correspondingly connect the two first electrodes of the first electrode unit 610 and the two second electrodes of the second electrode unit 620, respectively.

The third electrode unit 630 is bent in a "ㄱ" shape or a "ㄴ" shape in a single bent gate type.

The third voltage V3 is applied to the bent point P1 of the third electrode unit 630.

The third electrode unit 630 may be connected with a first plate 650 of a capacitor through a contact hole at the bent point P1, and the second electrode unit 620 may be connected with a second plate of the capacitor or function as the second plate, thereby forming one capacitor.

The first electrode unit 610 is formed with two first electrode protrusions 611 and 612 that function as the two first electrodes, and the second electrode unit 620 is formed with two second electrode protrusions 621 and 622 that function as the two second electrodes.

The two channels CH1 and CH2 are formed at the positions where the two first electrode protrusions 611 and 612 formed on the first electrode unit 610 face the two second electrode protrusions 621 and 622 of the second electrode unit 620, respectively.

In accordance with one embodiment, the end portions of the two first electrode protrusions 611 and 612 formed on the first electrode unit 610 are not parallel to each other, and the end portions of the two second electrode protrusions 621 and 622 formed on the second electrode unit 620 are not parallel to each other.

As an example, the end portions of the two first electrode protrusions 611 and 612 formed on the first electrode unit 610 are orthogonal to each other, and the end portions of the two second electrode protrusion 621 and 622 formed on the second electrode unit 620 are orthogonal to each other.

Due to this feature and the bent third electrode 630, the two channels CH1 and CH2 may be formed not to be parallel to each other.

Upon comparing FIG. 6 with FIG. 2, the first electrode unit 610, the second electrode unit 620, and the third electrode unit 630 in FIG. 6 correspond to the first electrode unit E1, the second electrode unit E2, and the third electrode unit E3, respectively. In addition, the two first electrode protrusions 611 and 612 in FIG. 6 correspond to the first electrode e1 of the first transistor TR1 and the first electrode e1' of the second transistor TR2 in FIG. 2, respectively, while the two second electrode protrusions 621 and 622 in FIG. 6 correspond to the second electrode e2 of the first transistor TR1 and the second electrode e2' of the second transistor TR2 in FIG. 2, respectively.

Further, the first electrode unit 610 and the second electrode unit 620 of the transistor 600 according to the second exemplary embodiment are formed on different bodies, respectively, unlike the first exemplary embodiment.

In addition, the two channels CH1 and CH2 of the transistor 600 according to the second exemplary embodiment may be formed in a layer which is different from the layer where the first electrode unit 610 and the second electrode unit 620 are formed unlike the first exemplary embodiment and may be formed in a semiconductor layer which is made of amorphous silicon (a-Si:H) or low temperature polycrystalline silicon (LTPS).

In addition, the second electrode unit 620 of the transistor 600 according to the second exemplary embodiment may include a portion which is bent in the same shape as the bent shape of the third electrode unit 630. That is, the second electrode unit 620 may include a portion formed in a "ㄱ" shape, a "ㄴ" shape or a "ㄷ" shape.

When the second electrode unit 620 is formed in the "ㄱ" shape or the "ㄴ" shape as described above, a semiconductor layer 640 in the "ㄴ" shape or the "ㄱ" shape may be formed between the first electrode unit 610 and the second electrode unit 620.

Referring to FIG. 7, a process of forming the transistor 600 according to the second exemplary embodiment illustrated in FIG. 6 will be described. FIG. 7 is a cross sectional view taken along line B-B' in FIG. 6.

First, the third electrode unit 630 corresponding to a gate electrode is formed on a substrate 710.

After forming the third electrode unit 630 according to the gate electrode, a gate insulation layer 720 is formed.

The semiconductor layer 640 made of amorphous silicon (a-Si:H) or low temperature polycrystalline silicon (LTPS) is formed on the gate insulation layer 720.

After forming the semiconductor layer 640, an interlayer insulation film 730 is formed.

Then, the first electrode unit 610 and the second electrode unit 620 are formed. At this time, the first electrode unit 610 and the second electrode unit 620 are connected with the semiconductor layer 640 through a contact hole.

The transistor 600 according to the second exemplary embodiment illustrated with reference to FIGS. 6 and 7 may be, for example, an amorphous silicon TFT or a low temperature polycrystalline silicon TFT.

Figure 8:
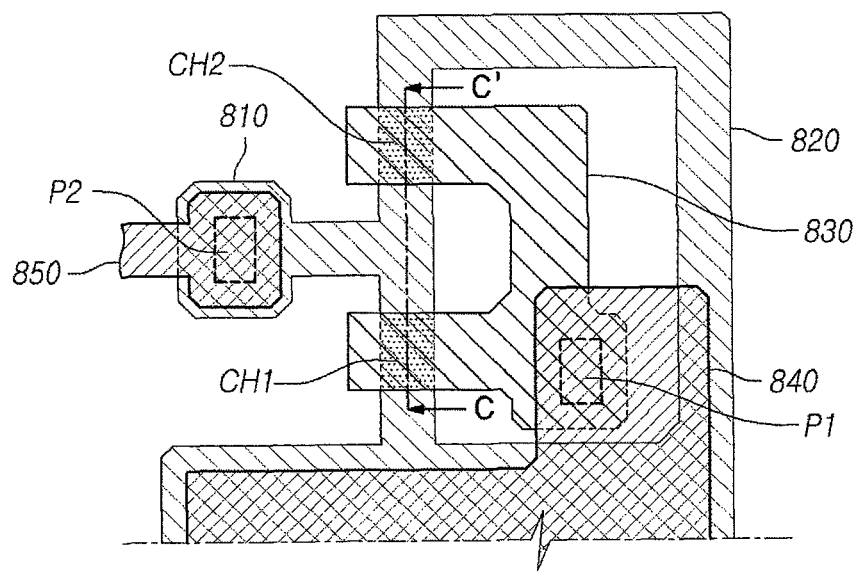
FIG. 8 is a plan view of a transistor according to a third exemplary embodiment.
Figure 9:
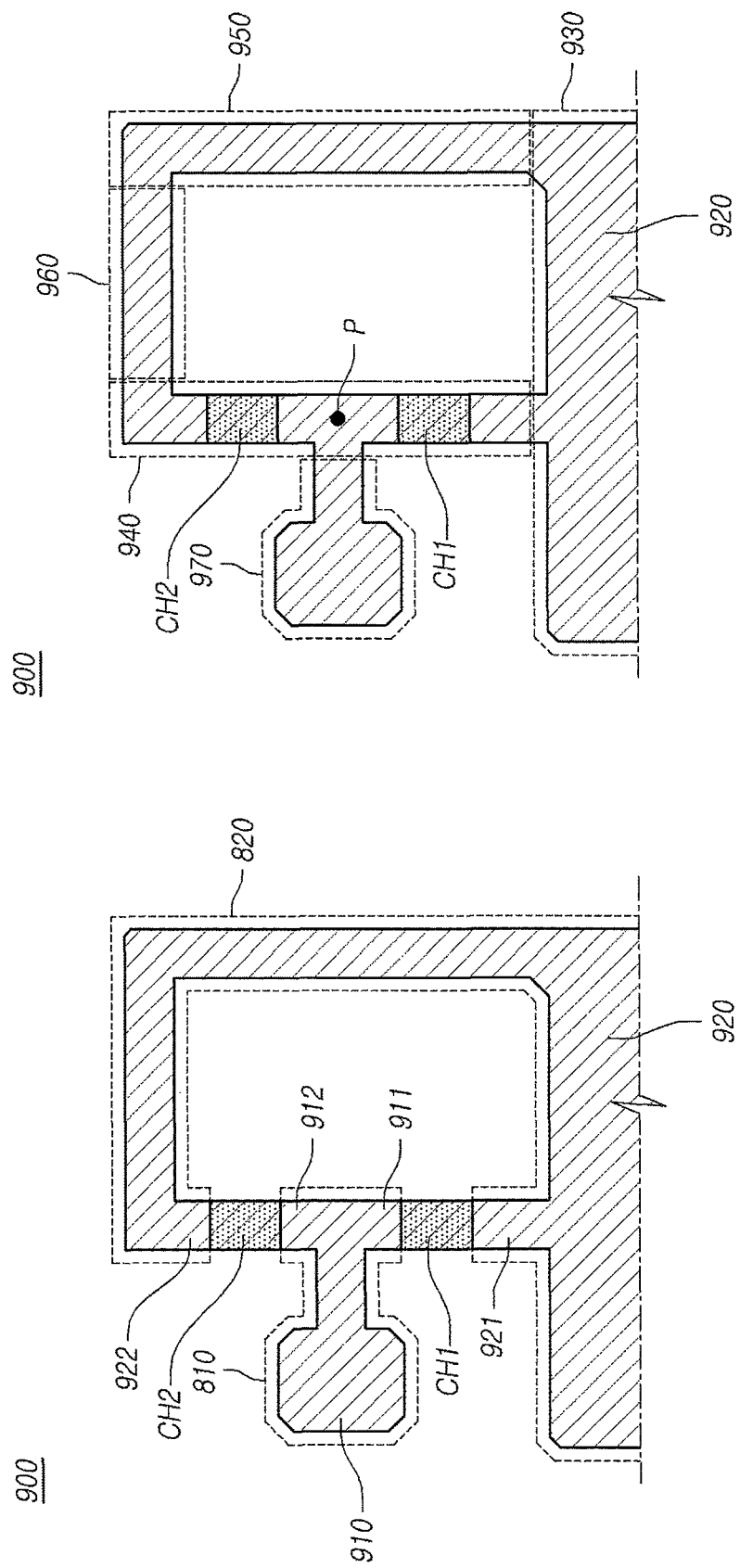
FIG. 9 is a view illustrating a single body of the transistor according to the third exemplary embodiment.
Figure 10:
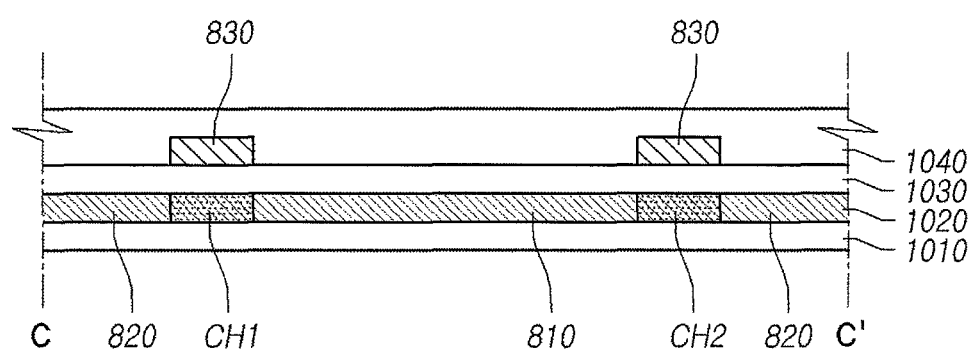
FIG. 10 is a cross-sectional view of the transistor according to the third exemplary embodiment.

With reference to FIGS. 8 to 10, a transistor 800 according to a third exemplary embodiment will be described.

FIG. 8 is a plan view of the transistor 800 according to the third exemplary embodiment FIG. 9 is a view illustrating a single body 900 of the transistor 800 according to the third exemplary embodiment, and FIG. 10 is a cross-sectional view of the transistor 800 according to the third exemplary embodiment.

Referring to FIG. 8, the transistor 800 according to the third exemplary embodiment includes: a first electrode unit 810 applied with a first voltage V1 and configured to function as two first electrodes; a second electrode unit 820 formed with a second voltage V2 and configured to function as two second electrodes; a third electrode unit 830 applied with a third voltage V3 and configured to function as a common third electrode, the third electrode unit 830 being formed in a bent shape between the first electrode unit 810 and the second electrode unit 820; and two channels CH1 and CH2 formed to be spaced apart from each other at points where opposite ends of the third electrode unit 830 are positioned and configured to correspondingly connect the two first electrodes of the first electrode unit 810 and the two second electrodes of the second electrode unit 820, respectively.

Referring to FIG. 8, the transistor 800 according to the third exemplary embodiment is a double bent gate type transistor in which the third electrode unit 830 is bent in a "ㄷ" shape.

Referring to FIG. 8, one point (e.g., P1) of the bent points of the third electrode 830 is a point where the third voltage V3 is applied.

Referring to FIG. 8, the third electrode unit 830 may be connected with a first plate 840 of a capacitor through a contact hole at one point (e.g., P1) of the bent points, and the second electrode unit 820 may be connected with a second plate of the capacitor, thereby forming a capacitor.

Referring to FIG. 8, the first electrode unit 810 is connected with a signal wire 850 configured to supply the first voltage through a contact hole at a point P2.

Referring to FIGS. 8 and 9, the first electrode unit 810 is formed with a first electrode body 910, and two first electrode protrusions 911 and 912 that function as two first electrodes, and the second electrode unit 820 is formed with a second electrode body 920 and two second electrode protrusions 921 and 922 that function as two second electrodes.

When FIGS. 8 and 9 are compared with FIG. 2, the first electrode unit 810, the second electrode unit 820, and the third electrode unit 830 in FIG. 8 correspond to the first electrode unit E1, the second electrode unit E2, and the third electrode unit E3 in FIG. 2, respectively. In addition, the two first electrode protrusions 911 and 912 in FIG. 9 correspond to the first electrode e1 of the first transistor TR1 and the first electrode e1' of the second transistor TR2 in FIG. 2, respectively, and the two second electrode protrusions 921 and 922 in FIG. 9 correspond to the second electrode e2 of the first transistor TR1 and the second electrode e2' of the second transistor TR2, respectively.

Referring to FIGS. 8 and 9, the two channels CH1 and CH2 are formed at positions where the two first electrode protrusions 911 and 912 of the first electrode unit 810 face the two second electrode protrusions 921 and 922 formed on the second electrode unit 820, respectively.

Referring to FIGS. 8 and 9, the end portions of the first electrode protrusions 911 and 912 formed on the first electrode unit 810 are parallel to each other, and the end portions of the two second electrode protrusions 921 and 922 of the second electrode unit 820 are parallel to each other. Accordingly, the two channels CH1 and CH2 may be formed in parallel to each other.

Referring further to FIG. 9, the first electrode unit 810, the second electrode unit 820, and the two channels CH1 and CH2 of the transistor 800 according to the third exemplary embodiment may be formed together in a single body 900.

The single body 900 is made of a semiconductor material, for example.

In the single body 900 made of a semiconductor material as described above, other than regions where the two channels CH1 and CH2 will be formed, only the remaining region is made conductive so as to form the first electrode unit 810 and the second electrode unit 820.

Here, the semiconductor material may be a metallic oxide semiconductor material, for example.

The metallic oxide semiconductor material may be, for example, a zinc-oxide based material, and may also be a zinc-oxide based material containing indium. Specifically, the metallic oxide semiconductor material may be, for example, Indium Gallium Zinc Oxide (IGZO), Zinc Tin Oxide (ZTO), and Indium Zinc Oxide (IZO).

Thus, the single body 900 is made of a metallic semiconductor material and the first electrode unit 810 and the second electrode unit 820 may be formed by making the single body 900 conductive, for example, by a plasma process or an ion doping process.

When the first electrode unit 810 and the second electrode unit 820 are formed in the regions which are made conductive in the single body 900, the regions which are not made conductive correspond to the two channels CH1 and CH2.

Referring to FIG. 10, a process of forming the transistor 800 according to the third exemplary embodiment illustrated in FIG. 8 will be described. FIG. 10 is a cross-sectional view taken along C-C' in FIG. 8.

First, a semiconductor layer 1020 is formed on a substrate 1010. Here, the semiconductor layer 1020 corresponds to the single body 900 of FIG. 9.

In the semiconductor layer 1020, other than the regions where the two channels CH1 and CH2 will be formed, the remaining region is made conductive so as to form the first electrode unit 810 and the second electrode unit 820.

After portions of the semiconductor layer 1020 are made conductive, the first electrode unit 810 and the second electrode unit 820 are formed in the regions which are made conductive in the semiconductor layer 1020, while the regions which are not made conductive become the two channels CH1 and CH2.

A gate insulation layer 1030 is formed on the semiconductor layer 1020 which is made conductive.

The third electrode unit 830 corresponding to the gate electrode is formed on the gate insulation layer 1030.

As illustrated in the plan view of FIG. 8, the third electrode unit 830 is formed to be bent in a " ⊏ " shape to overlap with the semiconductor layer 1020 corresponding to the single body 900 at two positions.

After the third electrode unit 830 corresponding to the gate electrode is formed, an interlayer insulation film 1040 is formed.

In accordance with one embodiment, the two channels CH1 and CH2 are formed to be parallel to each other. A structure related to this will be described in more detail with reference to FIG. 9.

Referring to FIG. 9, the single body 900 includes a " ⊓ " shape section. That is, FIG. 9 illustrates the " ⊓ " shape section included in the single body 900.

Referring to FIG. 9, the " ⊓ " shape section included in the single body 900 includes a body portion 930, side bars 940 and 950 connected with the body portion 930, a side bar 960 connecting the side bars 940 and 950 connected with the body portion 930, and a protrusion 970 connected to the center of one side bar 940 of the side bars 940 and 950 connected with the body portion 930.

Referring to FIG. 9, the first electrode unit 810 is formed on the protrusion 970, and the two channels CH1 and CH2 are formed to be parallel to each other adjacent to the opposite ends of the one side bar 940 with reference to a point P where the protrusion 970 is connected.

The transistor 800 according to the third exemplary embodiment may be, for example, an oxide TFT.

Hereinafter, a transistor 1100 according to a fourth exemplary embodiment of the present invention will be described with reference to FIGS. 11 and 12.

As will be described below, the transistor 1100 according to the fourth exemplary embodiment is the same as the transistor 800 according to the third exemplary embodiment in that the transistor 1100 is a double bent gate type transistor in which a third electrode unit 1130 corresponding to a gate electrode is bent at two positions but is different from the transistor 800 according to the third exemplary embodiment in that the semiconductor material is not made of a metallic oxide semiconductor material but made of amorphous silicon (a-Si:H) or low temperature polycrystalline silicon (LTPS). Accordingly, the features which are different from those of the transistor 800 according to the third exemplary embodiment will be mainly described below.

Figure 11:
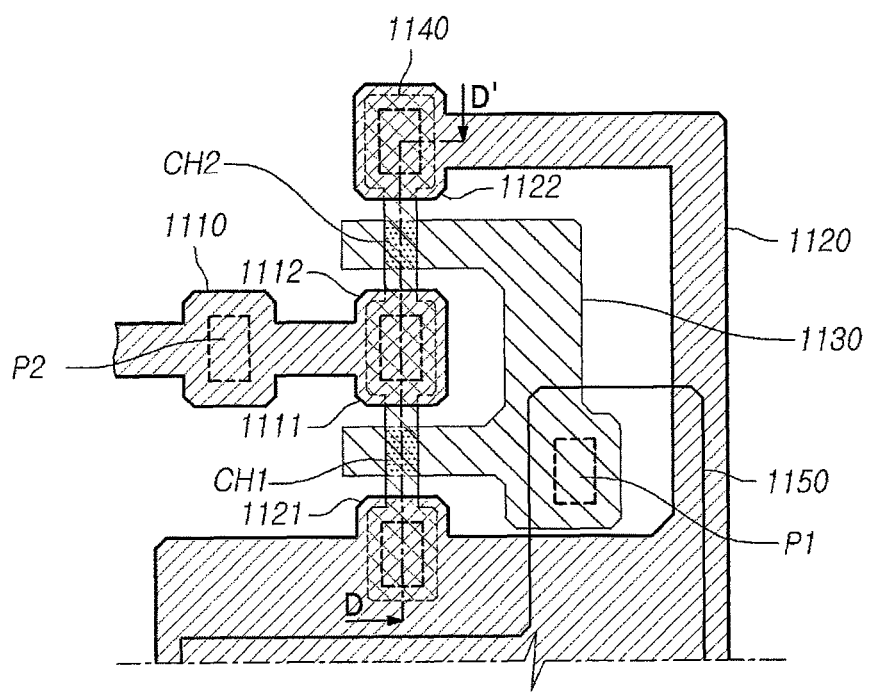
FIG. 11 is a plan view of a transistor according to a fourth exemplary embodiment.
Figure 12:
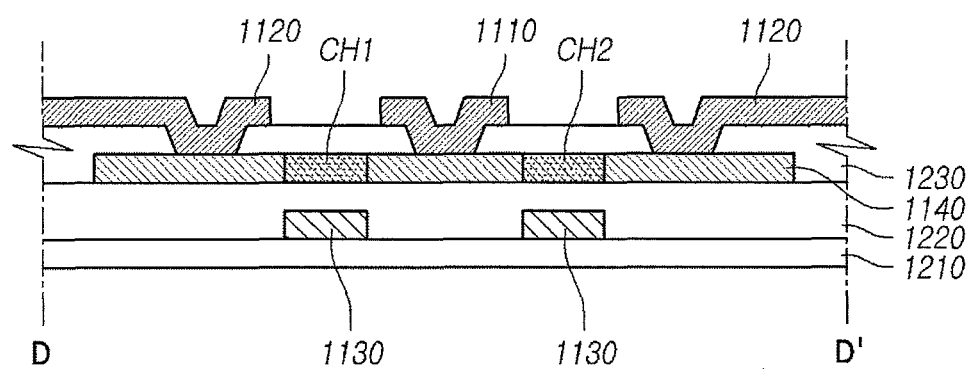
FIG. 12 is a cross-sectional view of the transistor according to the fourth exemplary embodiment.

FIG. 11 is a plan view of the transistor 1100 according to the fourth exemplary embodiment, and FIG. 12 is a cross-sectional view illustrating a cross-sectional view of the transistor 1100 according to the fourth exemplary embodiment.

Referring to FIG. 11, the transistor 1100 according to the fourth exemplary embodiment includes: a first electrode unit 1110 applied with a first voltage V1 and configured to function as two first electrodes; a second electrode unit 1120 formed with a second voltage V2 and configured to function as two second electrodes; a third electrode unit 1130 applied with a third voltage V3 and configured to function as a common third electrode, the third electrode unit 1130 being formed in a bent shape between the first electrode unit 1110 and the second electrode unit 1120; and two channels CH1 and CH2 which are formed to be spaced apart from each other at points where opposite ends of the third electrode unit 1130 are positioned and configured to correspondingly connect the two first electrodes of the first electrode unit 1110 and the two second electrodes of the second electrode unit 1120, respectively.

The transistor 1100 according to the fourth exemplary embodiment is a double bent gate type transistor in which the third electrode unit 1130 is bent at two positions in a "⊏" shape.

The third voltage V3 is applied to one point P1 of the bent points of the third electrode unit 1130 of the transistor 1100 according to the fourth exemplary embodiment of the present invention.

The third electrode unit 1130 may be connected with a first plate 1150 of a capacitor through a contact hole at the one point P1 of the bent points, and the second electrode unit 1120 may be connected with a second plate of the capacitor or functions as a second plate, thereby forming a capacitor.

Referring further to FIG. 11, the first electrode unit 1110 is formed with two first electrode protrusions 1111 and 1112 that function as the two first electrodes, and the second electrode unit 1120 is formed with two second electrode protrusions 1121 and 1122 that function as the two second electrodes.

The two channels CH1 and CH2 may be formed at the positions where the two first electrode protrusions 1111, 1112 formed on the first electrode unit 1110 face the two second electrode protrusions 1121 and 1122 formed on the second electrode unit 1120, respectively.

The end portions of the first electrode protrusions 1111 and 1112 formed on the first electrode unit 1110 may be parallel to each other, and the end portions of the two second electrode protrusions 1121 and 1122 formed on the second electrode unit 1120 may be parallel to each other. Thus, the two channels CH1 and CH2 may be formed to be parallel to each other.

Referring further to FIG. 11, the transistor 1110 according to the fourth exemplary embodiment is different from the transistor 800 according to the third exemplary embodiment in that the first electrode unit 1110 and the second electrode unit 1120 are formed in different bodies, respectively.

In addition, the transistor 1110 according to the fourth exemplary embodiment is different from the transistor 800 according to the third exemplary embodiment in that the two channels CH1 and CH2 are formed in a layer which is different from the layer where the first electrode unit 1110 and the second electrode unit 1120 are formed, and may be formed in a semiconductor layer which is made of amorphous silicon or low temperature polycrystalline silicon.

In addition, in the transistor 1110 according to the fourth exemplary embodiment, the second electrode unit 1120 may be bent in the same shape as the bent shape of the third electrode unit 1130.

Accordingly, the second electrode unit 1120 may be formed in the "⊏" shape.

When the second electrode unit 1120 is formed in the "⊏" shape, the first electrode unit 1110 is formed to be interposed between the opposite ends of the second electrode unit 1120, and one or two semiconductor layers 1140 in a "l" shape may be formed over one end of the second electrode unit 1120, the interposed portion of the first electrode unit, and the other end of the second electrode unit 1120.

Referring to FIG. 12, a process of forming the transistor 1100 according to the fourth exemplary embodiment illustrated in FIG. 11 will be described. FIG. 12 is a cross-sectional view taken along D-D' in FIG. 11.

First, the third electrode unit 1130 corresponding to a gate electrode is formed on a substrate 1210.

After the third electrode unit 1130 corresponding to the gate electrode is formed, a gate insulation layer 1220 is formed.

The semiconductor layer 1140 made of amorphous silicon (a-Si:H) or low temperature polycrystalline silicon (LTPS) is formed on a gate insulation layer 1220.

After the semiconductor layer 1140 is formed, an interlayer insulation film 1230 is formed.

Thereafter, the first electrode unit 1110 and the second electrode unit 1120 are formed. At this time, the first electrode unit 1110 and the second electrode unit 1120 are connected with the semiconductor layer 1140 through a contact hole.

The transistor 1100 according to the fourth exemplary embodiment described above with reference to FIGS. 11 and 12 may be, for example, an amorphous silicon TFT or a low temperature polycrystalline silicon TFT.

Hereinafter, a transistor 1300 according to a fifth exemplary embodiment will be described with reference to FIGS. 13 to 15.

As will be described below referring to FIGS. 13 to 15, the transistor 1300 according to the fifth exemplary embodiment is a bar gate type transistor in which a third electrode unit 1330 corresponding to a gate electrode is formed in a "—" shape (hereinafter, referred to as a "l" shape or a bar shape), and a semiconductor layer is made of a metallic oxide material.

Figure 13:
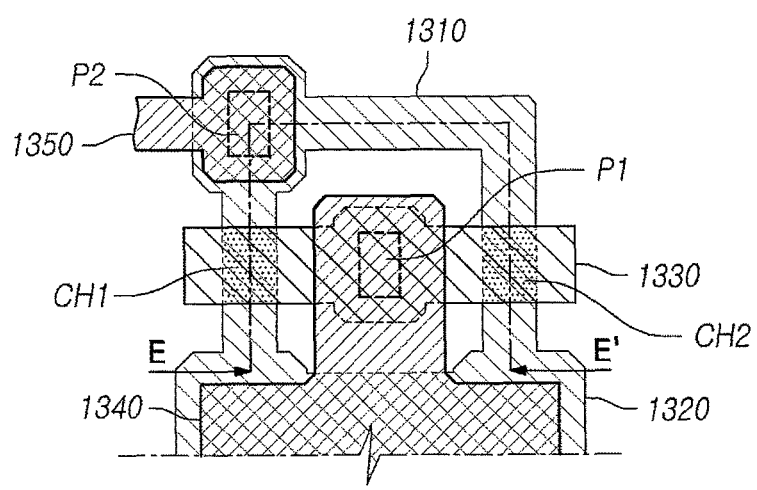
FIG. 13 is a plan view of the transistor according to a fifth exemplary embodiment.
Figure 14:
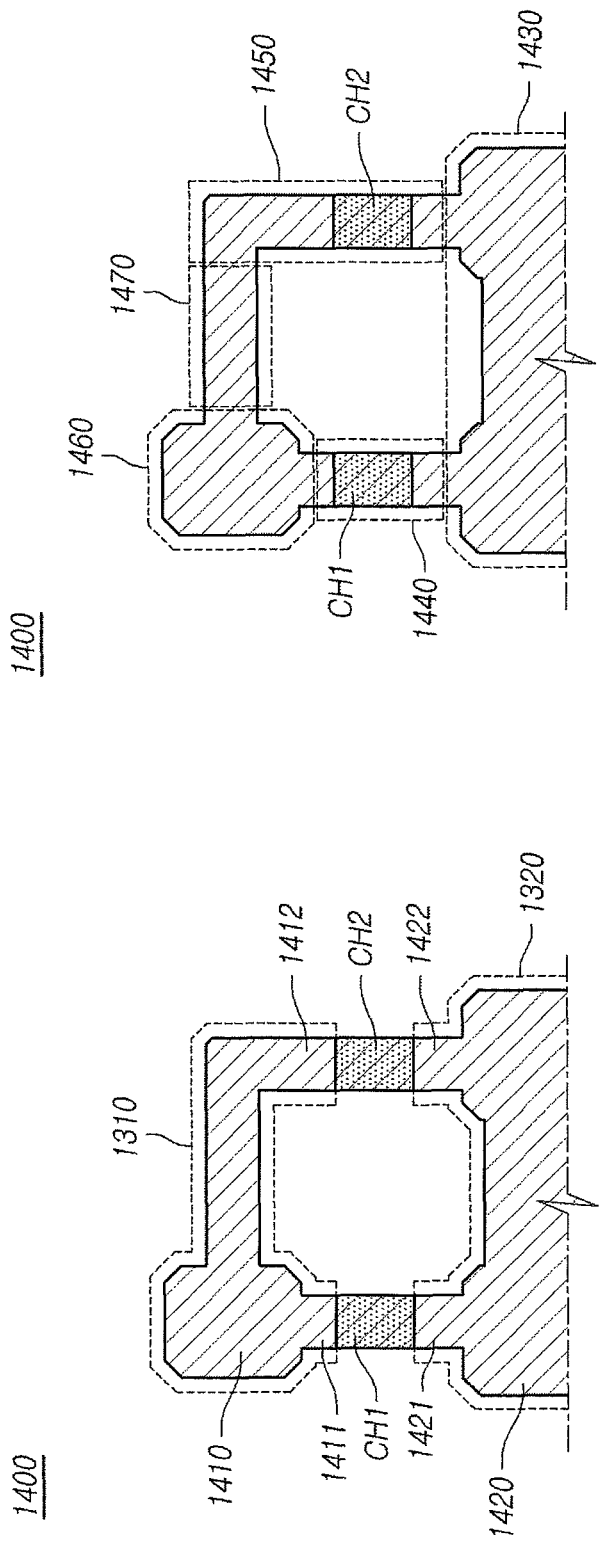
FIG. 14 is a view illustrating a single body of the transistor according to the fifth exemplary embodiment.
Figure 15:
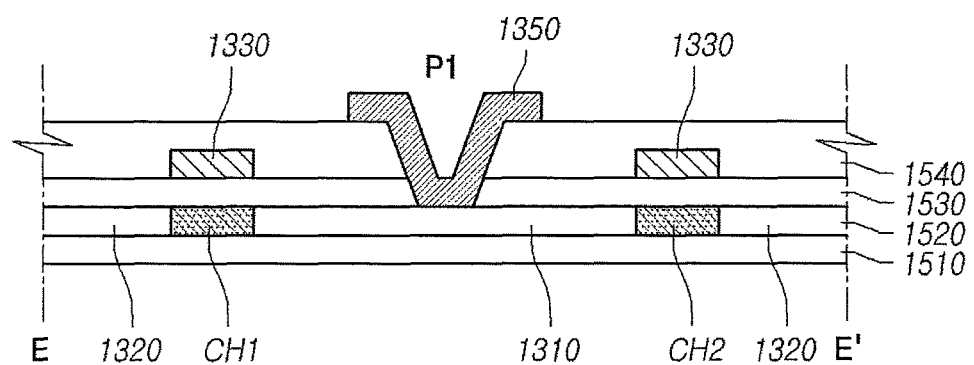
FIG. 15 is a cross-sectional view of the transistor according to the fifth exemplary embodiment.

FIG. 13 is a plan view of the transistor 1300 according to the fifth exemplary embodiment, FIG. 14 is a single body 1400 of the transistor 1300 according to the fifth exemplary embodiment, and FIG. 15 is a cross-sectional view of the transistor 1500 according to the fifth exemplary embodiment.

Referring to FIG. 13, the transistor 1300 according to the fifth exemplary embodiment includes: a first electrode unit 1310 applied with a first voltage V1 and configured to function as two first electrodes; a second electrode unit 1320 formed with a second voltage V2 and configured to function as two second electrodes; a third electrode unit 1330 applied with a third voltage V3 and configured to function as a common third electrode, the third electrode unit 1330 being formed in a "—" shape between the first electrode unit 1310 and the second electrode unit 1320; and two channels CH1 and CH2 configured to correspondingly connect the two first electrodes of the first electrode unit 1310 and the two second electrodes of the second electrode unit 1320, respectively.

The two channels CH1 and CH2 are formed to be parallel to each other and positioned between the opposite ends of the third electrode unit 1330 and the point P1 where the third voltage V3 is applied.

The third electrode unit 1330 is a bar gate type formed in a "—" shape.

The third electrode unit 1330 may be connected with a first plate 1340 of a capacitor through a contact hole at the point P1 where the third voltage V3 is applied, and the second electrode unit 1320 may connected with a second plate of the capacitor or function as the second plate itself, thereby forming a capacitor.

The first electrode unit 1310 is connected with a signal wire 1350 configured to supply the first voltage V1 through a contact hole at a point P2.

Referring to FIG. 14, the first electrode unit 1310 is formed with a first electrode body 1410, and two first electrode protrusions 1411 and 1412 that function as the two first electrodes and protruding from the first electrode body 1410.

The second electrode unit 1320 is formed with a second electrode body 1420 and two second electrode protrusions 1421 and 1422 that function as the two second electrodes and protrude from the second electrode body 1420.

When FIGS. 13 and 14 are compared with FIG. 2, the first electrode unit 1310, the second electrode unit 1320, and the third electrode unit 1330 in FIG. 13 correspond to the first electrode unit E1, the second electrode unit E2, and the third electrode unit E3, respectively. In addition, the two first electrode protrusions 1411 and 1412 in FIG. 14 correspond to the first electrode e1 of the first transistor TR1 and the first electrode e1' of the second transistor TR2 in FIG. 2, and the two second electrode protrusions 1421 and 1422 in FIG. 14 correspond to the second electrode e2 of the first transistor TR1 and the second electrode e2' of the second transistor TR2 in FIG. 2.

Referring to FIG. 14, the first electrode unit, the second electrode unit, and the two channels CH1 and CH2 are formed together in the single body 1400.

The single body 1400 is made of a semiconductor material, for example.

In the single body 1400 made of a semiconductor material as described above, other than the regions where the two channels CH1 and CH2 will be formed, the remaining region is made conductive so as form the first electrode unit 1310 and the second electrode unit 1320.

Here, the semiconductor material may include a metallic oxide semiconductor material, for example.

The metallic oxide semiconductor material may be, for example, a zinc-oxide based material. The metallic oxide semiconductor material may also be a zinc-oxide based material containing indium. Specifically, the metallic oxide semiconductor material may be, for example, Indium Gallium Zinc Oxide (IGZO), Zinc Tin Oxide (ZTO), and Indium Zinc Oxide (IZO).

Thus, the single body 1400 is made of a metallic oxide semiconductor material as described above, and the first electrode unit 1310 and the second electrode unit 1320 may be formed by making the single body 1400 conductive, for example, by a plasma process or an ion doping process.

When the first electrode unit 1310 and the second electrode unit 1320 are formed in regions which are made conductive in the single body 1400, the regions which are not made conductive correspond to the two channels CH1 and CH2.

Referring to FIG. 15, a process of forming the transistor 1300 according to the fifth exemplary embodiment which is illustrated in FIG. 13 will be described. FIG. 15 is a cross-sectional view taken along E-E' of FIG. 13.

First, a semiconductor layer 1520 is formed on a substrate 1510. Here, the semiconductor layer 1520 corresponds to the single body 1400 of FIG. 14.

In the semiconductor layer 1520, other than the regions where the two channels CH1 and CH2 will be formed, the remaining regions are made conductive so as to form the first electrode unit 1310 and the second electrode unit 1320.

After the semiconductor layer 1520 is made conductive, the first electrode unit 1310 and the second electrode unit 1320 are formed in the regions which are made conductive in the semiconductor layer 1520, and the regions which are not made conductive form the two channels CH1 and CH2.

A gate insulation layer 1530 is formed on the semiconductor layer 1520 which is made conductive.

On the gate insulation layer 1530, the third electrode unit 1330 corresponding to a gate electrode is formed.

Referring to the plan view of the transistor 1300 shown in FIG. 13, two portions in a "l" shape exist in the single body 1400 corresponding to the semiconductor layer 1520, and the third electrode unit 330 in a "—" shape is formed to cross the two portions formed in the "l" shape. Thus, the two channels CH1 and CH2 are formed.

After the third electrode unit 1330 corresponding to the gate electrode is formed, an interlayer insulation film 1540 is formed, and a signal wire 1350 configured to supply the first voltage V1 to the first electrode unit 1310 is connected with the first electrode unit 1310 through a contact hole at the point P2.

Further, when the two channels CH1 and CH2 are close to each other within a certain distance, it is highly probable that, when one of the first transistor TR1 formed with the channel CH1 and the second transistor TR2 formed with the channel CH2 is shorted or disconnected, one or both of the first electrode and the second electrode of the shorted or disconnected transistor may not be precisely cut, thereby resulting in a failure of the repair.

Accordingly, in order to enhance the success rate in repair without reducing a aperture ratio of the display panel 110, the fifth exemplary embodiment forms the two channels CH1 and CH2 not to be parallel to each other as illustrated in FIGS. 13 and 14 such that the two channels CH1 and CH2 can be positioned as distant from each other as possible.

In addition, in the fifth exemplary embodiment, the third electrode unit 1330 corresponding to the gate electrode is formed in a "—" shape. Thus, as compared with the first to fourth exemplary embodiments in which the third electrode unit has a "⌐" shape, an "∟" shape, or a "⊏" shape, it is possible to reduce the height (size) in the vertical direction where the transistor TR1 is arranged, thereby further increasing the aperture ratio.

In accordance with one embodiment, the " ⊔ " shape section included in the single body 1400 illustrated in FIG. 14 includes a body portion 1430, side bars 1440 and 1450 connected with the body portion 1430, a corner portion 1460 connected with one side bar 1440 of the side bars 1440 and 1450 connected with the body portion 1430, and a side bar 1470 connecting the corner portion 1460 and the other side bar 1450.

The first electrode unit 1310 is formed in the one corner portion 1460 of the " ⊔ " shape section included in the single body 1400, and the two channels CH1 and CH2 are formed in the side bar 1440 connected with the corner portion 1460 and the side bar 1450 which is parallel to the side bar 1440, respectively. As a result, the two channels CH1 and CH2 are formed to be parallel to each other.

The transistor 300 according to the fifth exemplary embodiment which is described above with reference to FIGS. 13 to 15 may be, for example, an oxide Thin Film Transistor (TFT).

Hereinafter, a transistor 1600 according to a sixth exemplary embodiment of the present invention will be described with reference to FIGS. 16 and 17.

As will be described below, the transistor 1600 according to the sixth exemplary embodiment is the same as the transistor 1300 according to the third exemplary embodiment in that the transistor 1600 is a bar gate type transistor in which a gate electrode is formed in a "—" shape but is different from the transistor 1300 according to the fifth exemplary embodiment in that the semiconductor material is not made of a metallic oxide semiconductor material but made of amorphous silicon (a-Si:H) or low temperature polycrystalline silicon (LTPS). Accordingly, the features which are different from those of the transistor 1300 according to the fifth exemplary embodiment will be mainly described below.

Figure 16:
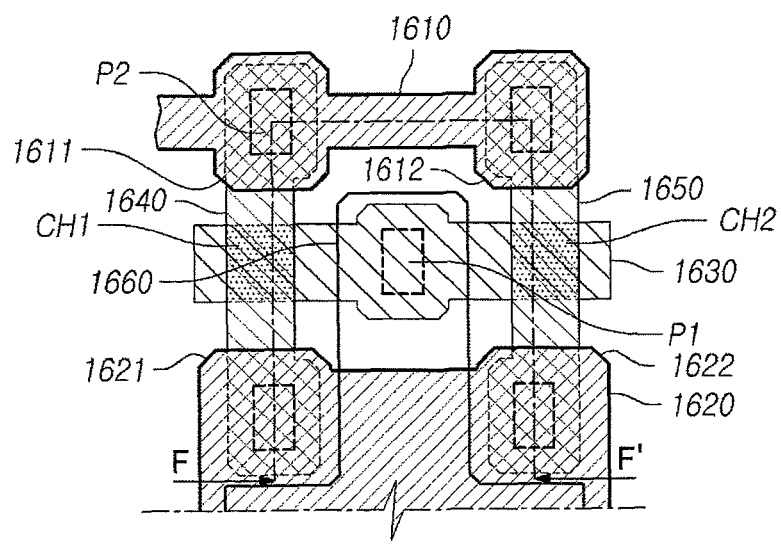
FIG. 16 is a plan view of a transistor according to a sixth exemplary embodiment.
Figure 17:
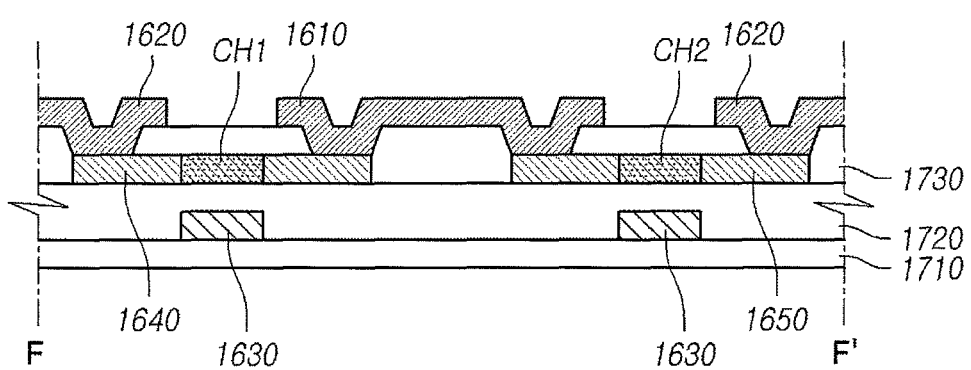
FIG. 17 is a cross-sectional view of the transistor according to the sixth exemplary embodiment.

FIG. 16 is a plan view of the transistor 1600 according to the sixth exemplary embodiment, and FIG. 17 is a cross-sectional view of the transistor 1600 according to the sixth exemplary embodiment.

Referring to FIGS. 16 and 17, the transistor 1600 according to the sixth exemplary embodiment includes: a first electrode unit 1610 applied with a first voltage V1 and configured to function as two first electrodes; a second electrode unit 1620 formed with a second voltage V2 and configured to function as two second electrodes; a third electrode unit 1630 applied with a third voltage V3 and configured to function as a common third electrode, the third electrode unit 1630 being formed between the first electrode unit 1610 and the second electrode unit 1620 in a "—" shape; and two channels CH1 and CH2 formed to be parallel to each other adjacent to points where opposite ends of the third electrode unit 1630 are positioned with reference to the point P1 where the third voltage V3 is applied and configured to correspondingly connect the two first electrodes of the first electrode unit 1610 with the two second electrodes of the second electrode unit 1620, respectively.

The first electrode unit 1610 is formed with two first electrode protrusions 1611 and 1612 that function as the two first electrodes, and the second electrode unit 1620 is formed with two second electrode protrusions 1621 and 1622 that function as the two second electrodes.

The two channels CH1 and CH2 are formed in parallel to each other at the positions where two first electrode protrusions 1611 and 1612 formed on the first electrode unit 1610 face the two second electrode protrusions 1621 and 1622 formed on the second electrode unit 1620, respectively.

In connection with this, the end portions of the two first electrode protrusions 1611 and 1612 formed on the first electrode unit 1610 are parallel to each other, and the end portions of the two second electrode protrusions 1621 and 1622 formed on the second electrode unit 1620 are parallel to each other.

When FIG. 16 is compared with FIG. 2, the first electrode unit 1610, the second electrode unit 1620, and the third electrode unit 1630 in FIG. 16 correspond to the first electrode unit E1, the second electrode unit E2, and the third electrode unit E3 in FIG. 2, respectively. In addition, the two first electrode protrusions 1611 and 1612 in FIG. 16 correspond to the first electrode e1 of the first transistor TR1 and the first electrode e1' of the second transistor TR2 in FIG. 2, respectively, while the two second electrode protrusions 1621 and 1622 in FIG. 16 correspond to the second electrode e2 of the first transistor TR1 and the second electrode e2' of the second transistor TR2 in FIG. 2, respectively.

In accordance with one embodiment, the first electrode unit 1610 and the second electrode unit 1620 of the transistor 1600 according to the sixth exemplary embodiment are formed in different bodies, respectively, unlike the fifth exemplary embodiment.

In addition, unlike the fifth exemplary embodiment, the two channels CH1 and CH2 of the transistor 1600 according to the sixth exemplary embodiment are formed in a layer which is different from the layer where the first electrode unit 1610 and the second electrode unit 1620 are formed and may be formed in a semiconductor layer made of amorphous silicon (a-Si:H) or low temperature polycrystalline silicon (LIPS).

In addition, the first electrode unit 1610, the third electrode unit 1630, and the second electrode unit 1620 of the transistor 1600 according to the sixth exemplary embodiment are formed to be parallel to each other, and two semiconductor layers 1640 and 1650 are formed to be spaced apart from each other and to be orthogonal to the first electrode unit 1610, the third electrode unit 1630, and the second electrode unit 1620.

The third electrode unit 1630 may be connected with a first plate 1660 of a capacitor through a contact hole at the point P1 where the third voltage V3 is applied, and the second electrode unit 1620 may be connected with a second plate of the capacitor or function as the second plate itself thereby forming a capacitor.

Referring to FIG. 17, a process of forming the transistor 1600 according to the sixth exemplary embodiment illustrated in FIG. 16 will be described. FIG. 17 is a cross-sectional view taken along F-F' in FIG. 16.

First, the third electrode unit 1630 corresponding to a gate electrode is formed on a substrate 1710.

After the third electrode unit 1630 corresponding to the gate electrode is formed, a gate insulation layer 1720 is formed.

On the gate insulation layer 1720, semiconductor layers 1640 and 1650 made of amorphous silicon (a-Si:H) or low temperature polycrystalline silicon (LTPS) are formed.

After the semiconductor layers 1640 and 1650 are formed, an interlayer insulation film 1730 is formed.

Thereafter, the first electrode unit 1610 and the second electrode unit 1620 are formed. At this time, through a contact hole, the first electrode unit 1610 and the second electrode unit 1620 are connected with the semiconductor layers 1640 and 1650.

The transistor 1600 according to the sixth exemplary embodiment described above with reference to FIGS. 16 and 17 may be, for example, an amorphous silicon TFT or a low temperature polycrystalline silicon TFT.

In the foregoing, descriptions have been made with respect to six exemplary embodiments of transistor structures configured such that, when a defect is found in a transistor in any of pixels defined in a display panel 110 of a display device 100, thereby causing a pixel defect, the transistor may be repaired so that the defective pixel can function as if it was a normal pixel.

In each of a plurality of pixels defined in the display panel 110 of the display device 100, a transistor according to at least one embodiment among the six embodiments of the present invention may be disposed. However, it should noted that those six embodiments of the invention as described above are provided for illustrative purposes, and the scope of the invention is not limited to the six embodiments. One of ordinary skill in the art would readily appreciate that transistor structures that can embody the circuitry shown in FIG. 2 may be within the scope of the present disclosure.

As noted above, when a pixel defect is generated because, for example, a foreign substance is introduced into the transistor, thereby causing the pixel to change into a bright dot or a dark dot, a repair process is required. Such a repair process may be performed during the panel fabrication process prior to manufacturing of the product being complete.

Accordingly, when a pixel defect has never occurred at all in any pixel among the plurality of pixels defined in the display panel 110 of the display device 100, it is expected that a transistor according to one or more embodiments among the six embodiments of the present invention as described above is disposed in every pixel.

However, when at least one pixel among the plurality of pixels defined in the display panel 110 of the display device 100 has a pixel defect and has been repaired, the at least one pixel among the plurality of pixels will include a transistor according to one or more embodiments among the six embodiments of the present invention that has been repaired.

Hereinafter, a repair process will be described with reference to FIG. 18, and structures of the transistors according to the six embodiments of the present invention after the repair process is performed will be described with reference to FIG. 19.

Figure 18:
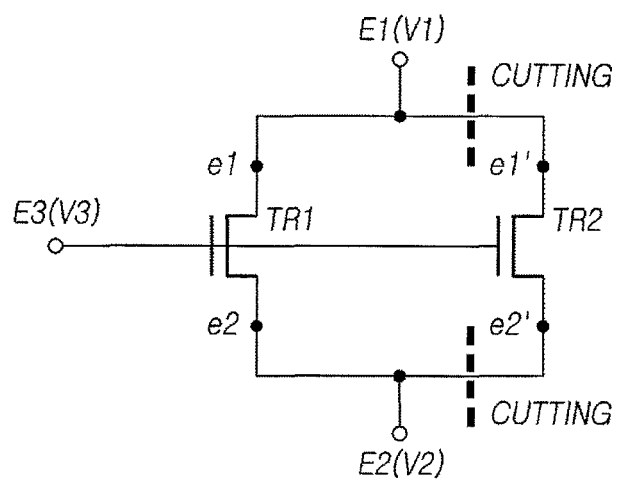
FIG. 18 is an equivalent circuit diagram of a transistor subjected to a repair process according to embodiments of the present invention.

FIG. 18 is an equivalent circuit diagram of a repaired transistor TR according to embodiments of the present invention.

FIG. 18 is a view of the transistor TR illustrated in FIG. 2 after a repair process is performed thereon.

Referring to FIG. 18, for example, when a pixel defect is generated because a foreign substance is introduced into the second transistor TR2, and the first electrode e1' and the second electrode e2' of the second transistor TR2 are shorted, thereby changing the corresponding pixel into a bright dot, at least one of the first electrode e1' and the second electrode e2' of the second transistor TR2 may be cut by a laser cutting process.

As a result, of the first transistor TR1 and the second transistor TR2, only the first transistor TR1 performs a switching operation such that the pixel defect may be repaired. Thus, the corresponding pixel may function again like a normal pixel.

When a repair process has been performed as described above for at least one of the pixels, the plurality of pixels defined in the display panel 110 may include at least one pixel provided with a transistor TR in which at least one of the first electrode protrusion and the second electrode protrusion is cut in at least one of the corresponding pairs (i.e., pair 1 (e1-e2) and pair 2 (e1'-e2')) of the two first electrode protrusions e1 and e1' of the first electrode unit E1 and the two second electrode protrusions e2 and e2' of the second electrode unit E2.

In addition, when at least one pixel has been repaired, the plurality of pixels defined in the display panel 110 may include at least one pixel which is provided with a transistor TR in which only one channel CH1 or CH2 is formed at only one of the opposite ends of the third electrode unit E3.

Figure 19:
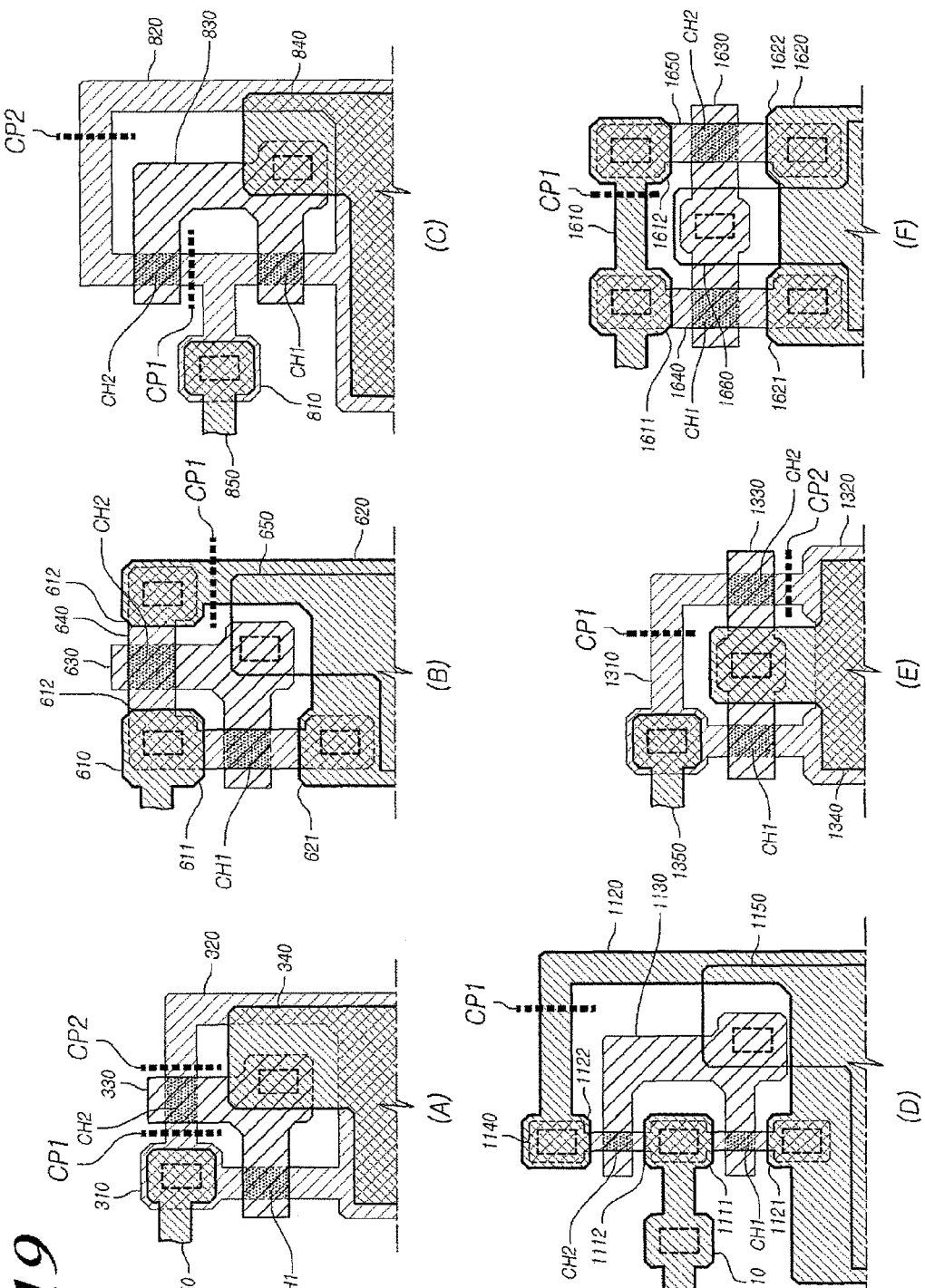
FIGS. 19a to 19f are plan views of the transistors according to the first to sixth exemplary embodiments which have been subjected to a repair process.

FIG. 19 illustrates transistors in which the repair process (e.g., cutting process) described with reference to FIG. 18 is applied to the first to sixth embodiments.

FIGS. 19a to 19f are plan views of repaired transistors 300, 600, 800, 1100, 1300, and 1600 according to the first to sixth embodiments.

Referring to FIGS. 19a to 19f, when a second transistor TR2 formed with a channel CH2 is the cause of a pixel defect in each of the repaired transistors 300, 600, 800, 1100, 1300, and 1600 according to the first to sixth exemplary embodiments, the first electrode e1' and the second electrode e2' of the second transistor TR2 may be cutting points CP1 and CP2 which may be subjected to the laser cutting process.

The display device 100 having a transistor structure according to each embodiment described above may be, for example, an organic light-emitting display device or a liquid crystal display device.

Hereinafter, an organic light-emitting display device and a liquid crystal display device that include transistor structures according to one or more embodiments of the present invention will be described respectively.

Figure 20:
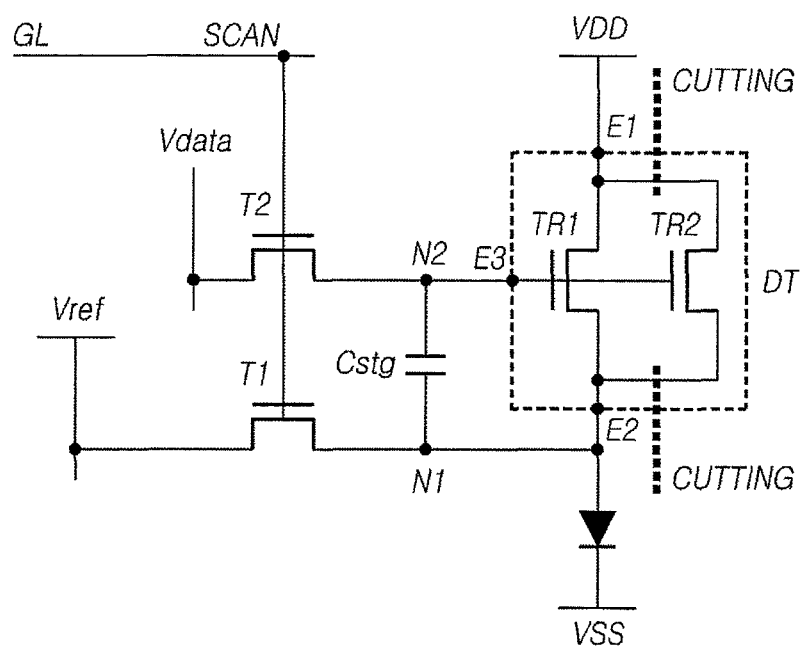
FIG. 20 is an equivalent circuit diagram of a pixel of an organic light-emitting display device including transistor structures according to embodiments of the present invention.
Figure 21:
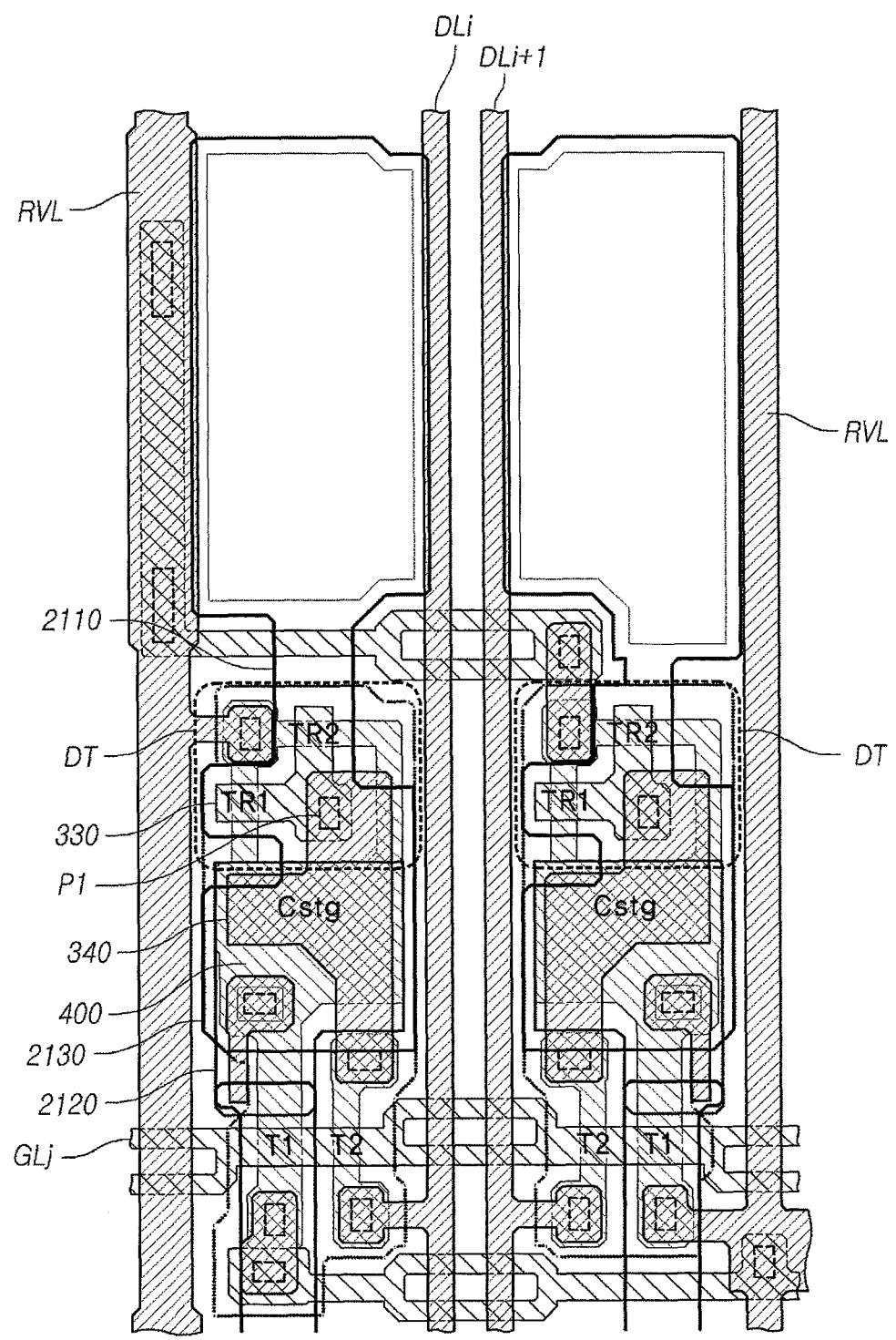
FIG. 21 is a cross-sectional view of an organic light-emitting display device including transistor structures according to embodiments of the present invention.

First, referring to FIGS. 20 and 21, an organic display device including a transistor structure according to one or more embodiments of the present invention is described.

FIG. 20 illustrates an equivalent circuit diagram of a pixel of an organic light-emitting display device in which the transistor structures according to first to sixth embodiments of the present invention are applied to a driving transistor DT, and FIG. 21 is a cross-sectional view of the organic light-emitting display device in which the transistor structure according to the first embodiment is applied to the driving transistor DT. However, in FIG. 21, only a pixel supplied with a data voltage from an $i_{th}$ data line DLi and a pixel supplied with a data voltage from a $(i+1)_{th}$ data line DLi+1 are indicated for ease of description.

Referring to FIGS. 20 and 21, an organic light-emitting display device including a pixel having a transistor structure according to embodiments of the present invention includes: an organic light-emitting diode (OLED); a driving transistor DT configured to be supplied with a driving voltage VDD and to drive the OLED; a first transistor T1 configured to be controlled by a scan signal SCAN supplied through a gate line GL and connected between a reference voltage line RVL configured to be supplied with a reference voltage Vref and a first node N1 of a driving transistor DT; a second transistor 12 configured to be controlled by the scan signal SCAN supplied through the gate line GL and connected between a data line DL and a second node N2 of the driving transistor DT; and a storage capacitor Cstg connected between the first node N1 and the second node N2 of the driving transistor DT.

One of the transistor structures according to the first to sixth embodiments may be applied to at least one of three types of transistors DT, T1 and T2 included in pixels of a conventional organic light-emitting display device.

FIGS. 20 and 21 are an equivalent circuit diagram of a pixel in which a transistor structure according to one embodiment of the present invention is applied to the driving transistor DT and a cross-sectional view of the organic light-emitting display device, respectively.

Referring to FIGS. 20 and 21, the driving transistor DT has a transistor structure in which two transistors TR1 and TR2 are connected in parallel to each other. Here, the driving transistor DT may have a transistor structure according to the first exemplary embodiment illustrated in FIG. 3.

Referring to FIGS. 20 and 21, when foreign substances are introduced into the second transistor TR2 of the two transistors TR1 and TR2 that form the driving transistor DT, at least one of the first electrode e1' and the second electrode e2' of the second transistor TR2 is cut by a laser cutting process.

Accordingly, only the first transistor TR1 of the two transistors TR1 and TR2 that form the driving transistor DT performs the switching operation such that a driving voltage can be supplied to the organic light-emitting diode (OLED).

Referring to FIG. 21 and FIG. 3, in the driving transistor DT, the third electrode unit 330 is formed to be bent, and the two channels CH1 and CH2 are formed not to be parallel to each other.

Referring to FIG. 21, FIG. 20 and FIG. 3, the bent point P1 of the third electrode unit 330 of the driving transistor DT is a point where a data voltage Vdata supplied through the data line DLi is applied through the second transistor 12 in the ON state. Here, the second transistor T2 is turned on/off controlled by a scan signal SCAN supplied through a gate line GLj.

The bent point P1 of the third electrode unit 330 of the driving transistor DT corresponds to the second node N2 in FIG. 20.

The third electrode unit 330 of the driving transistor DT is connected with the first plate 340 of the storage capacitor Cstg at the bent point P1, and the second electrode unit 320 of the driving transistor DT formed in a region made conductive in the single body 400 corresponding to the semiconductor layer 520 functions as the second plate of the storage capacitor Cstg. As a result, the storage capacitor Cstg is formed.

Further, one point in the region which is made conductive in the single body 400 corresponding to the semiconductor layer 520 is connected with a first electrode 2110 (anode or cathode) of the organic light-emitting diode (OLED) through a contact hole.

In accordance with one embodiment, in the region which is made conductive in the single body 400 corresponding to the semiconductor layer 520, the first electrode unit 310 and the second electrode unit 320 of the driving transistor DT are formed together with the source electrode and the drain electrode of the first transistor T1.

In addition, in the region which is not made conductive in the single body 400 corresponding to the semiconductor layer 520, the two channels CH1 and CH2 of the driving transistor DT are formed together with the channel of the first transistor.

Referring further to FIG. 21, in an organic light-emitting display device including a transistor structure according to one embodiment of the present invention, an over coat layer 2120 for planarization and protection of the display and a shield layer 2130 for use in light shielding may be formed.

Figure 22:
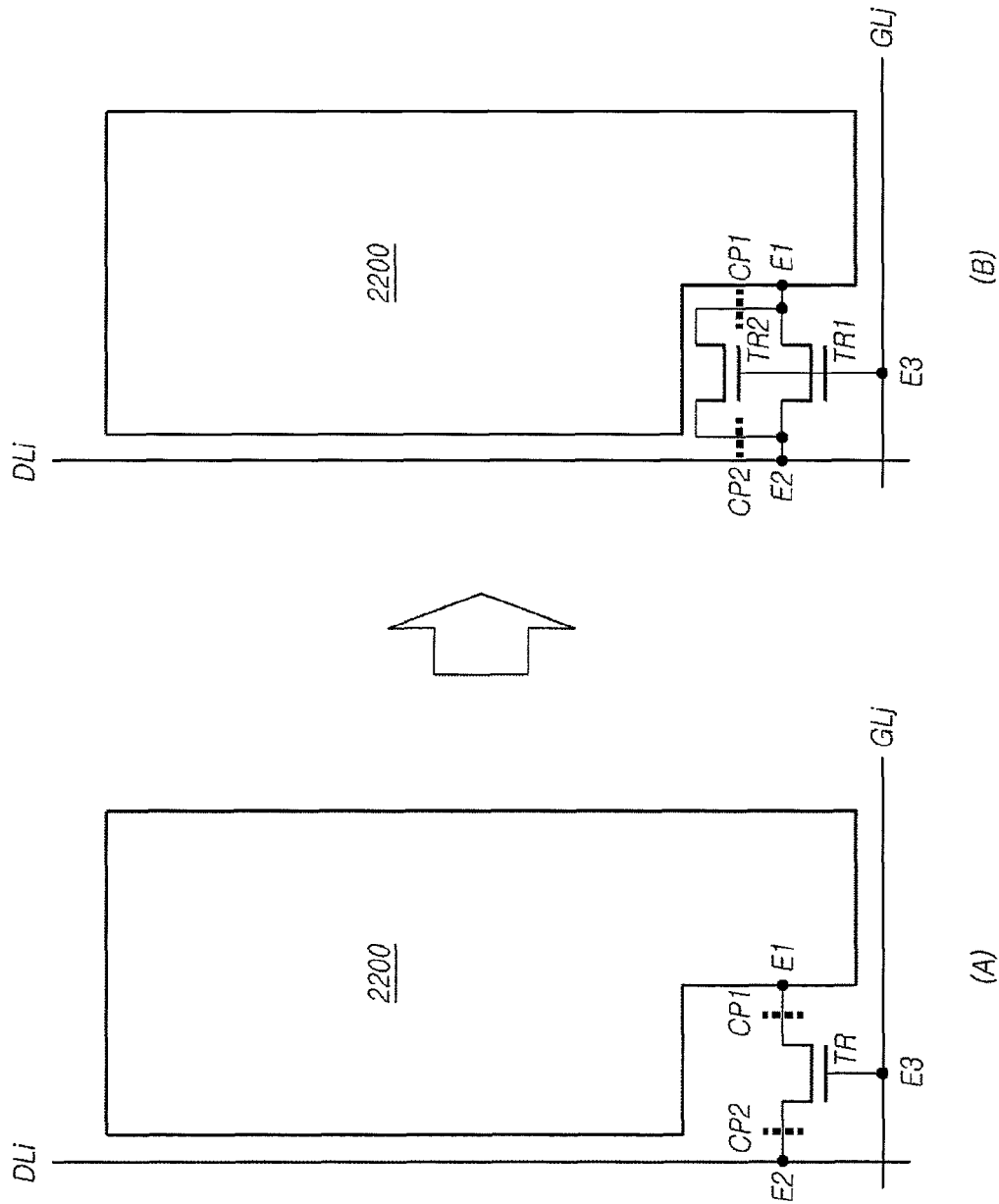
FIGS. 22a and 22b are plan views of a liquid crystal display device before and after transistor structures according to embodiments of the present invention are applied.

Hereinafter, a method of applying a transistor structure according to one embodiment of the present invention to a liquid crystal display will be described with reference to FIG. 22.

FIGS. 22a and 22b are plan views of a liquid crystal display device before and after a transistor structure according to exemplary embodiments is applied thereto.

FIGS. 22a and 22b illustrate a pixel defined by a $j_{th}$ gate line GLj and an $i_{th}$ data line DLi.

FIG. 22a illustrates a pixel to which a transistor structure according to the present invention is not applied, and FIG. 22b illustrates a pixel to which a transistor structure according one embodiment of the present invention is applied.

Referring to FIG. 22a, each pixel is defined by a data line and a gate line, and at least one transistor TR is disposed in each pixel.

Referring to FIG. 22a, the third electrode unit E3 corresponding to a gate electrode of a transistor TR is connected to the gate line GLj, the second electrode unit E2 corresponding to a source electrode (or a drain electrode) of a transistor TR is connected to the data line DLi, and the drain electrode (or the source electrode) of the transistor TR is connected with a pixel electrode 2200.

With respect to the display device as shown in FIG. 22a, when foreign substances are introduced into one transistor TR and, thus, the first electrode unit E1 and the second electrode unit E2 are shorted, the corresponding pixel becomes a bright dot. When it takes place, in order to repair the pixel changed into the bright dot, it is necessary to change the pixel into a dark dot by cutting two cutting points CP1 and CP2. Then, the pixel becomes a dead pixel that cannot perform a display function. When the number of dead pixels increases, the display panel may no longer be usable. That is, it is impossible to recover a pixel with a pixel defect to a normal pixel by a repair process with respect to the display device of FIG. 22a.

Referring to FIG. 22b, when a transistor structure according to any of the exemplary embodiment is applied to the transistor TR illustrated in FIG. 22a, the transistor TR will have a redundant structure in which the first transistor TR2 and the second transistor TR2 are connected in parallel to each other.

As described above, when a transistor structure according to one embodiment of the present invention is applied, even if foreign substances are introduced into any one of the first transistor TR1 and the second transistor TR2, the corresponding pixel can be normally operated by performing a repair process of removing the defective transistor with the foreign substances (in FIG. 22b, TR2) so that the remaining transistor TR1 can perform a switching operation.

The repair process of removing the transistor TR2 with the foreign matter means to cut at least one of two cutting points CP1 and CP2 which correspond to the first electrode e1' and the second electrode e2' of the transistor TR2 which contains the foreign substances therein, respectively.

Further, a redundant transistor structure according to embodiments of the present invention may be applied to the equivalent circuit diagram in FIG. 22b.

As described above, the present disclosure proposes a display device 100 having a redundant transistor structure which enables a repair process in such a manner that, when a foreign substance is introduced into a transistor to cause a pixel defect, the corresponding pixel can function as a normal pixel.

In addition, the present disclosure proposes a display device 100 having a redundant transistor structure capable of enhancing the repair success rate as well as enabling a repair process.

Further, the present disclosure proposes a display device 100 having a redundant transistor structure which does not reduce a aperture ratio of a display panel as well as enables a repair process.

That is, the present disclosure proposes a display device 100 having a redundant transistor structure which is capable of enhancing the success rate of a repair process as well as enabling the repair process, without reducing a aperture ratio.

Further, the present disclosure proposes a display device 100 including at least one pixel subjected to a repair process using a redundant transistor structure exists.

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, the exemplary embodiments of the present invention disclosed herein are intended to illustrate the scope of the technical idea of the present invention, and the scope of the present invention is not limited by the exemplary embodiments. The scope of the present invention shall be construed on the basis of the accompanying claims in such a manner that all of the technical ideas included within the scope equivalent to the claims belong to the present invention.

What is claimed is:

1. A display device comprising:
   a display panel including a plurality of data lines and gate lines formed to define a plurality of pixels;
   a data drive unit configured to supply a data voltage to the data lines; and
   a gate drive unit configured to supply a scan signal to the gate lines,
   wherein the display panel is provided with a transistor that includes:

a first electrode unit configured to receive a first voltage and including two first electrodes;

a second electrode unit configured to receive a second voltage and including two second electrodes;

a third electrode unit configured to receive a third voltage and including a common third electrode, the third electrode unit being formed to include a bent portion between the first electrode unit and the second electrode unit; and two channels formed to be spaced apart from each other adjacent to opposite ends of the third electrode unit and configured to correspondingly connect the two first electrodes and the two second electrodes, respectively.

2. The display device of claim 1, wherein the third electrode unit including the bent portion is formed in a "㄀" shape, a "ㄴ" shape, or a "ㄷ" shape.

3. The display device of claim 1, wherein the bent portion of the third electrode unit includes a portion where the third voltage is applied.

4. The display device of claim 3, wherein the third electrode unit is connected with a first plate of a capacitor at the bent portion, and the second electrode unit is connected with a second plate of the capacitor or is the second plate.

5. The display device of claim 1, wherein the first electrode unit includes two first electrode protrusions that function as the two first electrodes, and the second electrode unit includes two second electrode protrusions that function as the two second electrodes, and wherein the two channels are formed adjacent to positions where the two first electrode protrusions face the two second electrode protrusions, respectively.

6. The display device of claim 5, wherein end portions of the two first electrode protrusions are orthogonal to each other, and end portions of the two second electrode protrusions are orthogonal to each other, or the end portions of the two first electrode protrusions are parallel to each other, and the end portions of the two second electrode protrusions are parallel to each other.

7. The display device of claim 5, wherein the plurality of pixels defined in the display panel include at least one pixel provided with a transistor in which at least one pair of first and second electrode protrusions, among the two first electrode protrusions and the two second electrode protrusions, is disconnected.

8. The display device of claim 1, wherein the first electrode unit, the second electrode unit, and the two channels are formed together in a single body, and wherein the single body is made of a semiconductor material, and the first electrode unit and the second electrode unit include conductive portions of the single body.

9. The display device of claim 8, wherein the single body is made of a metallic oxide semiconductor material, and the first electrode unit and the second electrode unit include the conductive portions of the single body subject to a plasma process or an ion doping process.

10. The display device of claim 8, wherein, when the two channels are formed not to be parallel to each other, the single body includes a "ㅁ" shape section, and wherein the first electrode unit is formed in one corner portion of the "ㅁ" shape section, and the two channels are formed in two side bars which are connected to the one corner portion and are not parallel to each other.

11. The display device of claim 8, wherein, when the two channels are formed to be parallel to each other, the single body includes a "ㅁ" shape section, and wherein the first electrode unit is formed in a protrusion connected to a center of one side bar in the "ㅁ" shape section, and the two channels are formed at opposite ends of the one side bar with reference to the point where the protrusion is connected.

12. The display device of claim 1, wherein the first electrode unit and the second electrode unit are formed in different bodies, respectively, the two channels are formed in a layer which is different from a layer where the first electrode unit and the second electrode unit are formed, and the second electrode unit and third electrode unit are formed in a bent shape.

13. The display device of claim 12, wherein the second electrode unit includes a bent portion in a "㄀" shape, a "ㄴ" shape or a "ㄷ" shape.

14. The display device of claim 13, wherein, when the second electrode unit includes the bent portion in the "㄀" shape or the "ㄴ" shape, a semiconductor layer in the "ㄴ" shape or the "㄀" shape is formed between the first electrode unit and the second electrode unit, wherein, when the second electrode unit includes the bent portion in the "ㄷ" shape, the first electrode unit is formed to be interposed between opposite ends of the second electrode unit, and one or two semiconductor layers in a "l" shape are formed over one end of the second electrode unit, the interposed portion of the first electrode unit, and the other end of the second electrode unit.

15. The display device of claim 1, wherein the plurality of pixels defined in the display panel includes at least one pixel which is provided with a transistor in which a channel is formed adjacent to each of opposite ends of the third electrode unit.

16. A display device comprising:

a display panel including a data line and a gate line;

a data drive unit configured to supply a data voltage to the data line; and a gate drive unit configured to supply a scan signal to the gate line, wherein the display panel is provided with a transistor that includes:

a first electrode unit configured to receive a first voltage and including two first electrodes;

a second electrode unit configured to receive a second voltage and including two second electrodes;

a third electrode unit configured to receive a third voltage and including a common third electrode, the third electrode unit being formed in a "—" shape between the first electrode unit and the second electrode unit; and two channels formed in parallel to each other adjacent to opposite ends of the third electrode unit and configured to correspondingly connect the two first electrodes and the two second electrodes, respectively.

17. The display device of claim 16, wherein the first electrode unit, the second electrode unit, and the two channels are formed together in a single body, and wherein the single body is made of a semiconductor material, and the first electrode unit and the second electrode unit include conductive portions on the single body.

18. The display device of claim 17, wherein the single body includes a "ㅁ" shape section, and wherein the first electrode unit is formed in one corner portion of the "ㅁ" shape section, and the two channels are formed in a first side bar connected with the one corner portion and a second side bar parallel to the side bar, respectively.

19. The display device of claim 16, wherein the first electrode unit and the second electrode unit are formed in different bodies, respectively, wherein the two channels are formed in a layer which is different from a layer where the first electrode unit and the second electrode unit are formed, wherein the first electrode unit, the third electrode unit, and the second electrode unit are formed to be parallel to each other, and wherein two semiconductor layers are formed to be spaced apart from each other and orthogonal to the first electrode unit, the third electrode unit, and the second electrode unit.

* * * * *